US006092139A

United States Patent [19]
Crane, Jr. et al.

[11] Patent Number: 6,092,139
[45] Date of Patent: Jul. 18, 2000

[54] PASSIVE BACKPLANE CAPABLE OF BEING CONFIGURED TO A VARIABLE DATA PATH WIDTH CORRESPONDING TO A DATA SIZE OF THE PLUGGABLE CPU BOARD

[76] Inventors: Stanford W. Crane, Jr., 951 Broken Sound Pkwy., Boca Raton, Fla. 33404; Bruce A. Smith, 12641 NW. 13th Ct., Sunrise, Fla. 33323; Edward R. Vanderslice, 6965 NE. Ronler Way, #1914, Hillsboro, Oreg. 97124

[21] Appl. No.: 09/083,083

[22] Filed: May 22, 1998

Related U.S. Application Data

[63] Continuation of application No. 08/594,285, Jan. 30, 1996, abandoned, which is a continuation-in-part of application No. 08/208,877, Mar. 11, 1994, abandoned.

[51] Int. Cl.⁷ .................................................. G06F 13/38
[52] U.S. Cl. ...................... 710/127; 395/500.48; 710/62; 710/101; 710/104; 710/126
[58] Field of Search ......................... 395/500.48; 710/62, 710/101, 104, 126, 127

[56] References Cited

U.S. PATENT DOCUMENTS

| | | | |
|---|---|---|---|
| 4,979,075 | 12/1990 | Murphy | 361/399 |
| 5,065,141 | 11/1991 | Whitsitt | 340/635 |
| 5,119,498 | 6/1992 | McNeill et al. | 710/104 |
| 5,167,511 | 12/1992 | Krajewski et al. | 439/61 |
| 5,192,220 | 3/1993 | Billman et al. | 439/327 |
| 5,301,281 | 4/1994 | Kennedy | 710/127 |
| 5,617,546 | 4/1997 | Shih et al. | 710/561 |
| 5,625,802 | 4/1997 | Cho et al. | 395/500.48 |
| 5,630,163 | 5/1997 | Fung et al. | 710/127 |

FOREIGN PATENT DOCUMENTS

| | | |
|---|---|---|
| 0 237 193 | 11/1987 | European Pat. Off. . |
| 0 400 930 | 12/1990 | European Pat. Off. . |
| 0 509 765 | 10/1992 | European Pat. Off. . |
| 0 526 726 | 2/1993 | European Pat. Off. . |
| 0 574 133 | 12/1993 | European Pat. Off. . |
| 2 513 477 | 3/1983 | France . |

OTHER PUBLICATIONS

M.J. Doughterty, "A Sem–E Module Avionics Computer with PI–Bus Backplane Communication", Institute of Electrical and Electronics Engineers, May 21–25, 1990, pp. 169–173.

D. Eidsmore, "MC68000 and Z80A Share Multiprocesor Bus in S–100 SBC Line", Computer Design, Jun. 1982, Winchester, Massachusetts, vol. 21, No. 6, pp. 38–40.

Y. Belopolsky, "Interaction of Multichip Module Substrates with High–density Connectors" of IEEE Micro, Apr. 1993, vol 13, No. 2, ISSN 0272–1732, pp. 36–44.

C. Van Veen, "LRU Servicing Practice Impacts Interconnection", Electronic Product Design, Jun. 1992, UK., vol 13, No. 6, ISSN 0263–1474, pp. 45–47.

E. Baker and J. Shakib, "Input/Output Cards for Device Attachments", IBM Technical Disclosure Bulletin, vol. 27, No. 4b, Sep. 1984, New York, pp. 2406–2407.

(List continued on next page.)

*Primary Examiner*—Thomas C. Lee
*Assistant Examiner*—Chien Yuan
*Attorney, Agent, or Firm*—Morgan, Lewis & Bockius LLP

[57] ABSTRACT

A computer system includes a bus system having a local bus unit, a memory bus unit, an input/output bus unit, and an expansion bus unit. A pluggable central processing unit circuit board includes a microprocessor, a pluggable memory circuit board coupled to the central processing unit circuit board through the memory bus unit, and a pluggable bridge circuit board coupled to the central processing unit circuit board. A plurality of connectors includes a first connector unit for receiving the pluggable central processing unit circuit board; a second connector unit for receiving the pluggable memory circuit board; and a third connector unit for receiving the pluggable bridge circuit board. The third connector unit is coupled to the first connector unit of the central processing unit circuit board through the bus system. A plurality of peripheral devices are coupled to the bridge circuit board through the input/output bus unit. The bus system includes a variable data path width corresponding to a data size of the central processing unit circuit board.

15 Claims, 16 Drawing Sheets

OTHER PUBLICATIONS

M. Ernstberger et al., "The High Density Backplane Interconnect System", Connection Technology, Aug. 1991, vol. 7, No. 8, ISSN 8756–4076, pp. 19–21.

Readout, "Board Level Options for RISC processors", Electronic Engineering 61, Mar. 1989, NO. 747, Woolwich, London, GB, pp. 71–72.

C. Van Veen, "Making the Right Packaging Connections with Backplane Interconnections," Electronic Packaging & Production, Newton, MA, May 1991, pp. 76–79.

PASSIVE BACKPLANE CAPABLE OF BEING CONFIGURED TO A VARIABLE DATA PATH WIDTH CORRESPONDING TO A DATA SIZE OF THE PLUGGABLE CPU BOARD

CROSS REFERENCE TO RELATED APPLICATION

This application is a continuation of U.S. patent application Ser. No. 08/594,285 filed on Jan. 30, 1996 now abandoned, which is a continuation-in-part of U.S. patent application Ser. No. 08/208,877 filed on Mar. 11, 1994 now abandoned, the content of which is relied upon and incorporated by reference.

BACKGROUND OF THE INVENTION

1. Field of the Invention

The present invention relates to a computer and, more particularly, to a computer system architecture.

2. Discussion of the Related Art

Conventional computer systems contain electronic components that are located on printed circuit boards (PCBs). PCBs are also called "cards," daughtercards," or "motherboards." Conventional computers contain the majority of their components on a main PCB called a "motherboard." The motherboard usually contains at least a processor, memory, and a peripheral controller. The motherboard usually also contains various bus logic chips, buffers, bus protocol circuitry, and memory management chips.

Some conventional systems include PCBs in addition to the motherboard. These additional PCBs typically plug into sockets in the motherboard (also known as expansion slots) and PCBs contain electronics used by the motherboard, where the electronics are of a type compatible with the motherboard. Such electronics may include controllers for add-on peripherals, video circuitry, sound circuitry, etc. Other conventional systems contain a memory subsystem in low-bandwidth pluggable modules (called single in-line memory modules or "SIMMs") on one or more separate PCBs.

The electronic elements on a motherboard are connected to one another on the motherboard by one or more "busses" and by lines carrying various control signals. Busses transmit addresses, data, control signals, etc. between electronic components. A motherboard is connected to other PCBs by one or more "connectors." Each connector has "pins," some of which transmit signals that are passed between the motherboard and the other PCBs and some of which are connected to power or ground. Signal paths called "traces" connect the connectors on the PCBs, backplanes, and/or motherboards.

Conventional connectors that are used to connect PCBs cannot achieve a density much higher than eighty contacts per linear inch. This low density limits the number of pins that can be located on a connector and limits the possible width of busses connecting the motherboard to other PCBs. In addition, when a connector contains a relatively small number of pins, signals are often multiplexed on at least some of the pins. When two signals are multiplexed on a single pin, for example, the signals are transmitted at different times over the single pin.

Multiplexed signals add electronic overhead and slow the operational speed of the system. As an alternative to narrow busses and multiplexed signals, some conventional systems simply use very large connectors. Such a size increase causes timing problems. Similarly, undesirable effects such as noise, signal disturbances, propagation delay, and crosstalk increase along with connector size. Some connector pins must be used for power and ground signals. It is desirable to have a relationship of 2:1 or 3:1 between signal and power/ground. Yet, such a relationship is not possible within the limitations of conventional low density connectors. Thus, the pin-out limits and size of conventional connector technology places limitations on the types of electronic components that can be located on boards other than the motherboard.

Currently, it is becoming desirable for computer systems to be able to use whatever processor that works best for a certain task to be performed. For example, a first type of processor might work best for graphics processing while a second type of processor might be the best choice to act as a network server. It is desirable to be able to have a system that can interchange various types of processors according to, e.g., the task to be performed by the computer system. It is also desirable when changing a processor used by the system to be able to use an operating system and associated application software that are optimal for the new processor.

Generally, conventional computer systems include a processor on the motherboard. Some conventional systems allow a user to substitute processors by unplugging a first type of processor chip from the motherboard and replacing it with a second type of processor chip. Such substitution, however, can only be performed between processor chips having identical bus sizes and similar architectures. Specifically, both processor chips must be compatible with the other electronics on the motherboard.

In conventional systems, the architecture of a computer system is dictated by a type of processor used in the computer system. Thus, for example, a processor chip on a motherboard cannot be upgraded to a processor chip having a different architecture. To use a processor having a different architecture, the other components on the motherboard must be redesigned to operate with the new processor. Similarly, a type of peripheral controller used in a system determines a type of peripheral bus used in the system and a type of peripheral cards accepted by the system. To use a new type of peripheral bus in a system, the motherboard must be redesigned to accept a corresponding new type of peripheral controller.

The evolution of the personal computer has been marked by significant increases in processor speed. Bus widths have continued to increase for every new generation of processor. It is now common to integrate memory management and peripheral support functions into "chip sets." The introduction of a new processor or chip set has previously required that the computer's motherboard be redesigned to benefit fully from the increased functionality and bandwidth of the new processor. The high speeds and dense packages dictate that the processor, the chip set, and the bus that interconnects them be placed on a single motherboard. The use of a motherboard limits the extent to which an existing system can be upgraded when new technologies become available because a motherboard is designed to operate only with certain bus widths, memory management schemes, peripheral busses and expansion slots.

In general, therefore, it is desirable to make the components of a computer system as modular as possible. When most of the components of a computer system are located on a motherboard, the motherboard will necessarily be large. Manufacture of these large boards is more complex than manufacture of small boards and, therefore, large boards are more difficult and costly to manufacture. In general, the effects of the many small tolerances required by a large motherboard combine to cause manufacturing problems for large boards, resulting in a lower yield of usable boards during the manufacturing process. Large boards also must be thicker than small boards to avoid warpage and to facilitate routing of tracer.

In addition, the larger a board is, the more components are located on the board. Large boards are also more difficult and costly to repair than small boards because, for example, if a single component on a motherboard is faulty, the entire board must be removed from the computer for repair or replacement. As stated above, although it is desirable to have modular components in a computer system, the pin-out limits of conventional connectors make modularity impractical.

SUMMARY OF THE INVENTION

Accordingly, the present invention is directed to a computer system architecture that substantially obviates one or more of the problems due to limitations and disadvantages of the related art.

An object of the present invention is the provision of a new computer system architecture to make computer assembly more flexible and modular.

Another object of the present invention is the provision of a flexible computer system architecture having the ability to migrate functional components from one location to another.

Additional features and advantages of the invention will be set forth in the description which follows, and in part will be apparent from the description, or may be learned by practice of to the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the invention includes a backplane for a computer system comprising a bus system including a local bus, a memory bus, and an input/output bus; a plurality of connectors including: a first connector unit for receiving a central processing unit; a second connector unit, coupled to the first connector unit through the memory bus, for receiving a memory unit; and a third connector unit for receiving a bridge unit, the third connector unit being coupled to the first connector unit and the bus system; wherein the bus system includes a variable data path width corresponding to a data size of the central processing unit.

In another aspect, the invention is a computer system comprising a bus system including a local bus unit, a memory bus unit, an input/output bus unit, and an expansion bus unit; a pluggable central processing unit circuit board including a microprocessor; a pluggable memory circuit board coupled to the central processing unit circuit board through the memory bus unit; a pluggable bridge circuit board coupled to the central processing unit circuit board; a plurality of connectors including: a first connector unit for receiving the pluggable central processing unit circuit board; a second connector unit for receiving the pluggable memory circuit board; and a third connector unit for receiving the pluggable bridge circuit board, the third connector unit being coupled to the first connector unit of the central processing unit circuit board through the bus system; and a plurality of peripheral devices coupled to the bridge circuit board through the input/output bus unit; wherein the bus system includes a variable data path width corresponding to a data size of the central processing unit: circuit board.

In a further aspect, the invention is a computer system comprising a bus system including a local bus unit having a primary bus and a secondary bus, a memory bus unit, an input/output bus unit, and an expansion bus unit; a pluggable central processing unit circuit board including a microprocessor; a pluggable memory circuit board coupled to the central processing unit circuit board through the memory bus unit; a pluggable bridge circuit board coupled to the central processing unit circuit board; a connector system including: a first connector unit including a first set of connectors, for receiving the pluggable central processing unit circuit board; a second connector unit including a second set of connectors, for receiving the pluggable memory circuit board; and a third connector unit including a third set of connectors, for receiving the pluggable bridge circuit board, wherein a subset of the first set of connectors of the first connector unit have predefined contacts and respectively coupled to a subset of the third set of connectors of the third connector unit through the primary bus and the expansion bus unit; and a plurality of peripheral devices coupled to the bridge circuit board through the input/output bus unit; wherein the bus system includes a variable data path width corresponding to a data size of the central processing unit circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
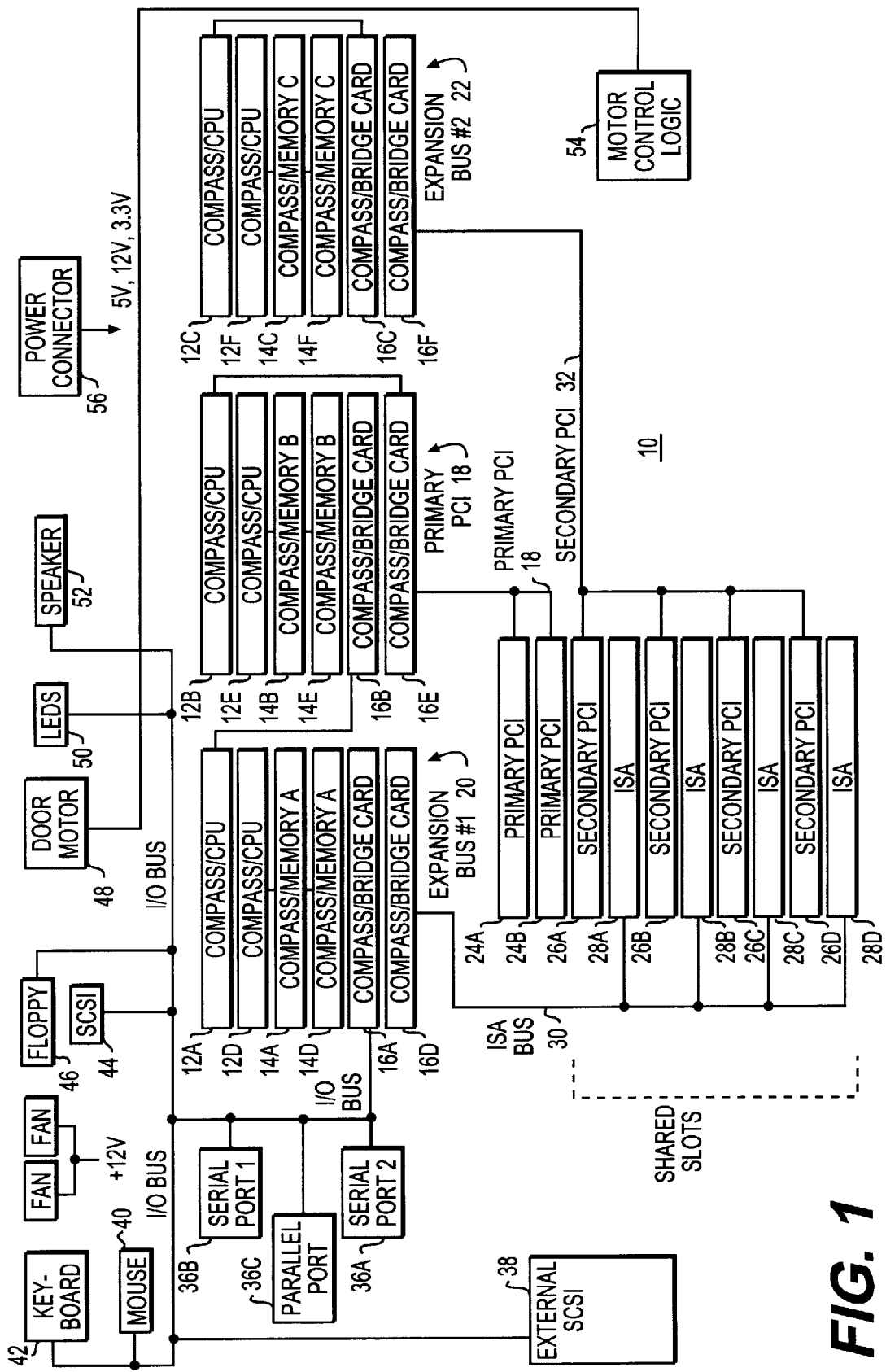
FIG. 1 is an illustration of an embodiment of the backplane architecture for the computer system of the present invention.

FIG. 1 illustrates an embodiment of the backplane architecture 10 for the computer system of the present invention. The backplane architecture 10 includes high density connectors for receiving three types of circuit boards or cards— the CPU, memory, and bridge. There are preferably six connectors 12A, 12B, 12C, 12D, 12E, and 12F for the CPU card, six connectors 14A, 14B, 14C, 14D, 14E, and 14F for the memory card, and six connectors 16A, 16B, 16C, 16D, 16E, and 16F for the bridge card, for a total of 18 high density connectors. Of course, the cards may have more or less than 18 connectors depending on the number of signals needed for a design.

High density connectors are preferably the type as discussed in U.S. patent application Ser. No. 08/208,877 filed on Mar. 11, 1994, entitled "Modular Architecture For High Bandwidth Computers," which is the parent application to this continuation-in-part application.

The signal routing between the connectors on the backplane are designed to maximize the number of uncommitted or undefined signals between various card slots to allow flexibility in designing the card. For example, of the 18 high density connectors, signals from five of the connectors are predefined between various card slots whereas signals for the remaining thirteen connectors are not predefined to provide a flexible architecture. In the present preferred embodiment, the five connectors (12B, 16A, 16D, 16E, and 16F) have predefined signals (or fixed definitions) which are attached to industry standard interfaces. The signals from the fixed definition connectors are predefined according to the type of industry standard interfaces used. For example, connector 16A of the bridge card is connected to serial and parallel ports (36A, 36B, 36C), peripheral devices such as keyboard 42 and mouse 40, small computer serial interface (SCSI) 44, and floppy drive 46. Connector 16A is connected to these interfaces through the I/O bus, and predefined accordingly. Connector 16D of the bridge card is connected to the industry standard adapters (ISA) 28(A–D) through the ISA bus 30 and predefined accordingly. Also, enhanced industry standard adapters (EISA) may be used instead of or in conjunction with ISA.

Connector 16E of the bridge card is connected to the primary PCI slots 24A and 24B through the 64-bit primary PCI bus 18 and also to connector 12B of the CPU card through the 64-bit primary PCI bus 18. Here, connector 12B may be predefined such that the address and data, PCI signals, interrupt request lines, and the interrupt controller communications bus have fixed definitions and respectively connected to connector 16E. Connector 16E of the bridge card may be predefined such that the address and data, PCI signals, interrupt request lines, and the interrupt controller communications bus are defined consistent with connector 12B of the CPU card. In addition, connector 16E includes grant and request lines predefined and connected to the grant and request lines of the primary PCI slots 24A and 24B. Connector 16F of the bridge card may be predefined and connected to the 64-bit secondary PCI bus 32. The applications of the secondary PCI bus will be discussed later.

Figure 3:
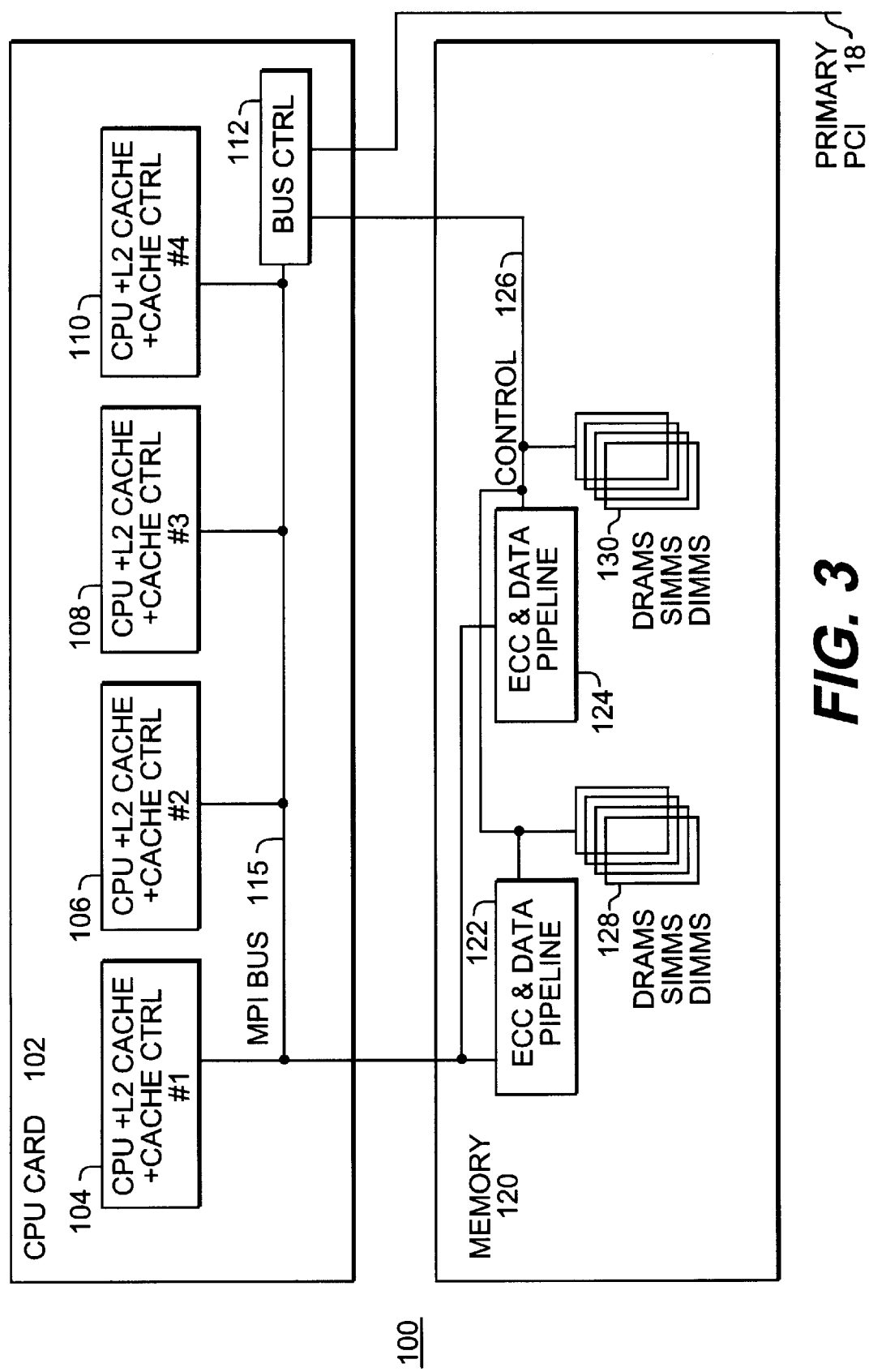
FIG. 3 is a block diagram of a multiprocessor chip set design in accordance with the embodiment of the present invention.

The remainder of the connectors provide for very wide busses between the card slots that are defined by the cards plugged into those locations. For instance, in one preferred system, the connections between the CPU and memory slots may include those control signals needed to address a standard RAM array including data, RAS, CAS, memory address, etc. However, in another preferred system, those same signal traces could take on different definitions, such as a multiprocessor (MP) bus. This allows for at least some of the memory control functions to reside on the memory cards instead of on the CPU cards. This topology is shown in FIG. 3, which is an exemplary design utilizing the LSI Logic HYDRA™ multiprocessor (MP) chip set. This flexibility is a key differentiator of the architecture—the ability to migrate functional components from card to card and adapt to current and future chip set architectures.

Figure 2:
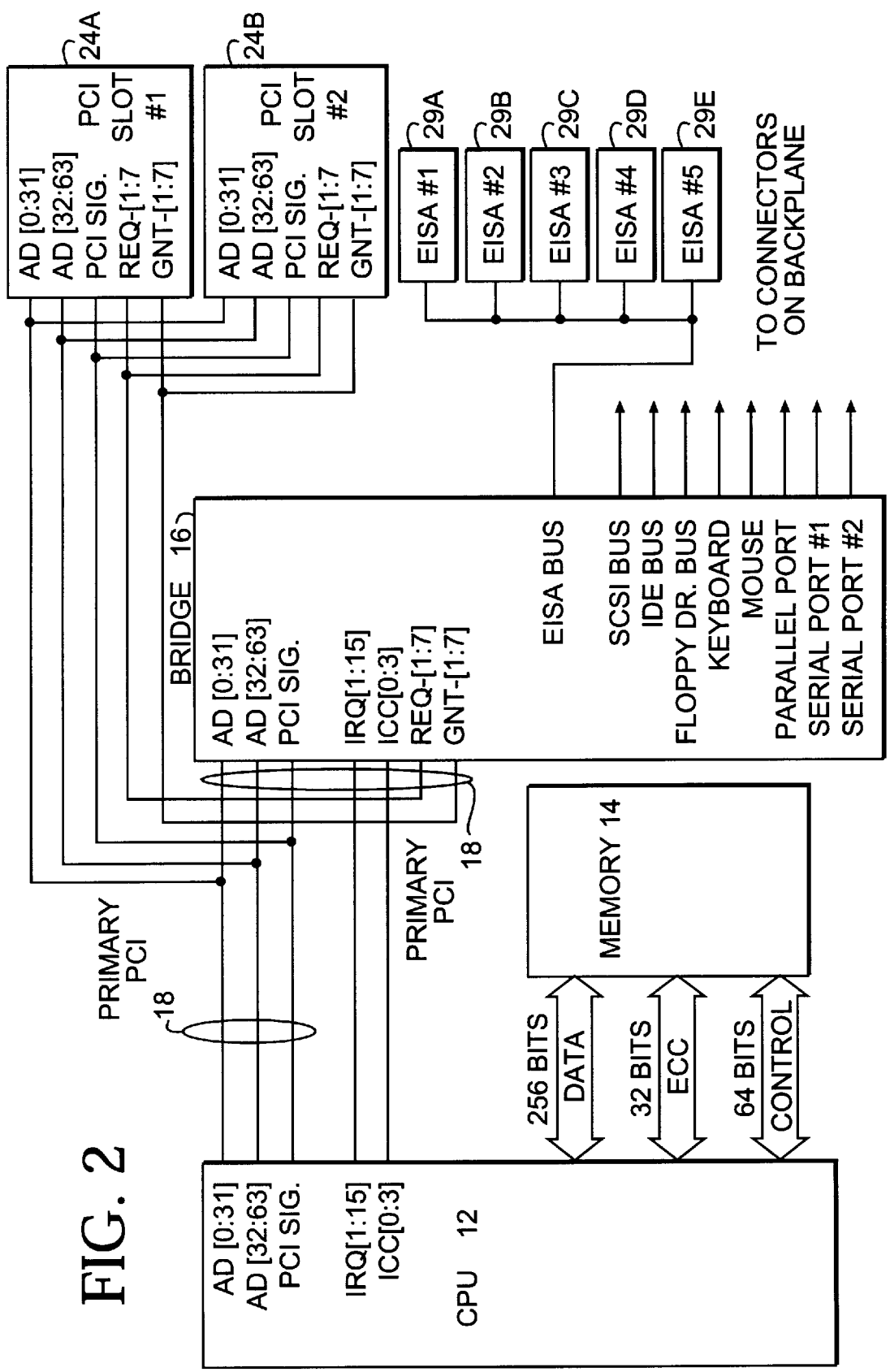
FIG. 2 is a block diagram showing an arrangement and interconnection of parts for a design of CPU, memory, and bridge PCBs on the backplane of the present invention.

An exemplary embodiment in accordance with the present invention is shown in FIG. 2. FIG. 2 is a block diagram of connections between a CPU card, a memory card, a bridge card, PCI slots, EISA slots, and I/O on the backpanel platform of the present flexible architecture. In particular, the CPU card 12 is connected to the memory card 14 and bridge card 16. The connection between the CPU card 12 and the memory card 14 is through a 352 bit wide bus which includes 256 bits for data, 32 bits for ECC, and 64 bits for control signals. The 352 bits of signal traces are originally designed into the backplane architecture but only those bits needed for a particular design are utilized. For example, a 64 bit microprocessor utilizes 64 bits of the 256 bit wide data bus or a 128 bit microprocessor utilizes 128 bits of the 256 bit data bus. Thus, the data path width of the bus is expandable or variable according to the microprocessor used. In FIG. 2, the CPU card is based on a 64 bit microprocessor (such as the Pentium™) and the connections from the CPU card 12 to the bridge card 16 and PCI slots are based on the 64 bit processor. As shown in FIG. 2, EISA slots (29A–E) may be used instead of the ISA slots in FIG. 1. Moreover, the secondary PCI, although capable in the architecture, may or may not be utilized depending on a particular application.

Accordingly, when designing the CPU card and the bridge card, for example, the predefined signals of the connectors must be consistent with both cards. However, the remaining, non-predefined signals need not be confined to specific pins on specific connectors. Hence, functions can be moved from a CPU card to a bridge card or a memory card and vice versa. For example, a memory control function may be moved from the CPU card to the memory card or a data transfer control function may be moved from the CPU card to the bridge card to adapt to current and future chip set architecture.

For example, consider a HYDRA™ chip set multiprocessor design of the LSD Logic Corporation. FIG. 3 shows a HYRDA™ chip set 100 implemented using the computer architecture of the present invention. The CPU card 102 includes multiple processor or CPU units (104, 106, 108 and 110), each unit including a CPU, an L2 cache, and a cache control. Each processor unit (104, 106, 108, 110) is connected to a multiprocessor interconnect bus (MPI) 115. The MPI bus is an open multiprocessing bus that is used in the HYDRA™ chip set. The MPI bus is a synchronous, shared-memory bus with multiplexed address and data lines. The MPI bus 115 may be 66 MHz with a bandwidth of 97 signals, for example. The backpanel provides the interconnections between the CPU and memory cards. The 97 signals of the MPI bus are defined in Table I below. The MPI bus 115 is connected to a bus control 112 which is connected to a primary PCI 18 and to the memory card 120.

TABLE I

| MAD[63:0] | MPI Address & Data (multiplexed) |
|---|---|
| MAP | Address Parity |
| MBOFF# | Back Off Signal |
| MCLK | MPI Clock |
| MCYCLE# | MPI Cycle Indicator |
| MECBE#[7:0] | MPI Error Checking & Byte Enables |
| MFAULT | MPI Fault Indicator |
| MHIT[4:0] | MPI Cache Hit Status |
| MLOCK# | Locked Cycle Indicator |
| MMIO | Memory or I/O Cycle Type Indicator |
| MRDYN# | Device Ready Signal |
| MREQ#[3:0] | Bus Request Signal |
| MGNT#[3:0] | Bus Grant Signal |
| MRST# | Bus Reset Signal |
| MSPLIT# | Split Transaction Indicator |
| MID[1:0] | Device Identifiers |

The memory card 120 in the HYDRA™ chip set 100 includes an error control and correction (ECC) and data pipeline units (122, 124). The ECC and data pipeline units buffer memory to the MPI bus 115. The MPI bus 115 and the bus control 112 are connected to the ECC and data pipeline units. The bus control 112, which provides a handshake between memory control and the MPI bus, is connected to the ECC & data pipelines through the control bus 126. As an example, the bus control signals are defined in Table II below.

TABLE II

| CAS#[1:0] | DRAM Column Address Strobe |
|---|---|
| EDPM[4:0] | ECC & Data Pipeline Control Signals |
| ERROR#[3.0] | Error Indicators |
| BE_VALID | EDP Control Signal |
| MA[11:1] | DRAM Memory Address |
| MAO[1:0] | Even & Odd MA O |
| RAS#[7:0] | DRAM Row Address Strobe |
| RASSEL | Additional DRAM Bank Control Signal |
| RASSEL# | Additional DRAM Bank Control Signal |
| REFRESH# | Additional DRAM Bank Control Signal |
| SLOTSEL[1:0] | EDP Chip Select Signal |
| WE# | DRAM Write Enable |
| MD_DIR | Memory Data Bus Direction |

Figure 4:
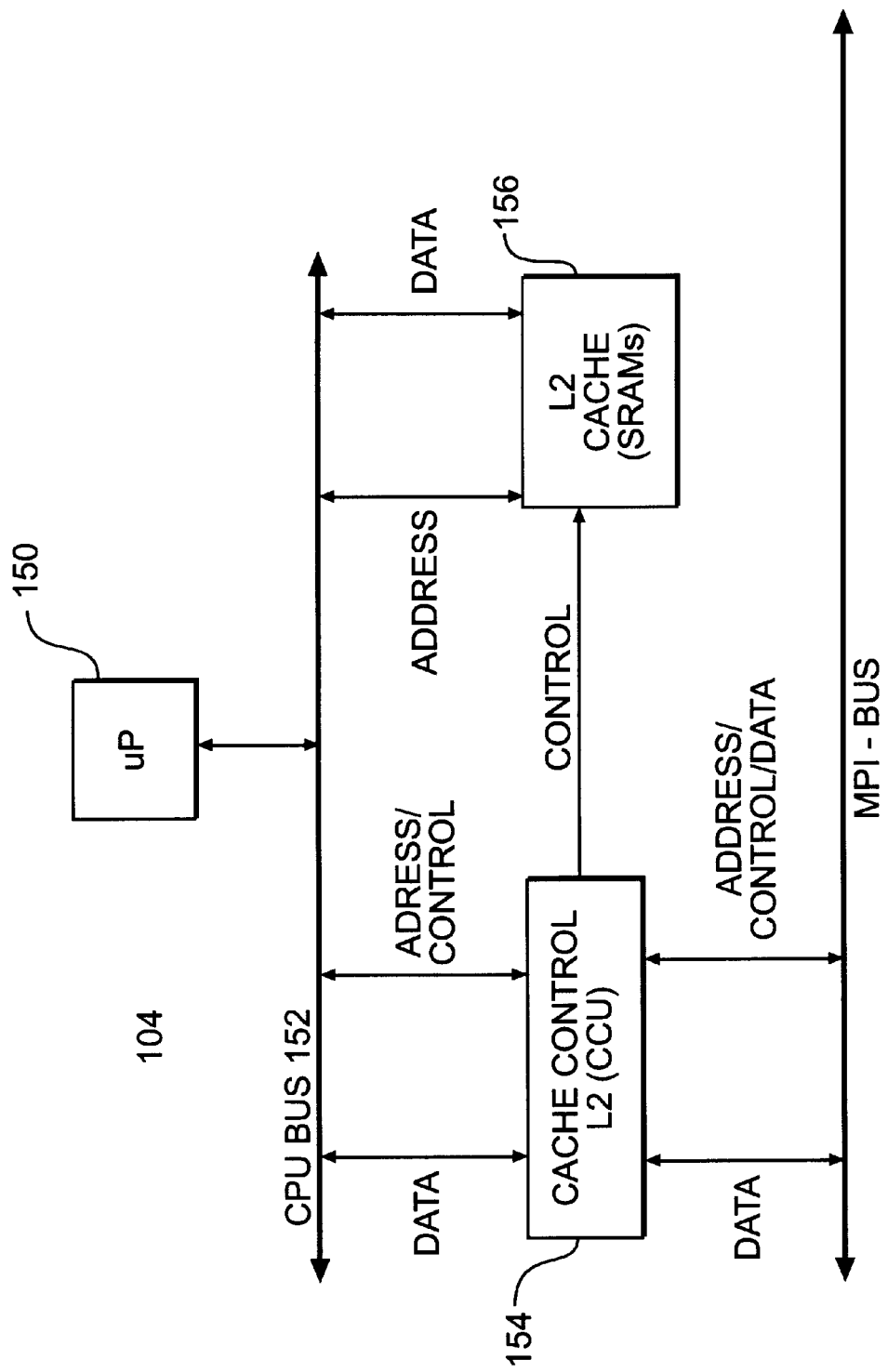
FIG. 4 is a block diagram of a CPU unit in the multiprocessor chip set design of FIG. 4.

As noted above, each of the CPU units (104, 106, 108, 110) includes a CPU, an L2 cache, and a cache control, as shown in more detail in FIG. 4. Referring to FIG. 4, the CPU 150 (such as the Pentium™ microprocessor) is connected to a CPU control unit (cache control L2) 154, which controls an L2 cache 156, for example, an SRAM.

Accordingly, the HYDRA™ chip set design can be easily implemented using the architecture of the present invention. Multiple CPU units including the CPU, L2 cache and control are designed onto the CPU card 102 which is pluggable onto the backplane of the present computer system. The ECC and data pipeline units as well as the memory chips are included in the memory card 120 (FIG. 3), which is also pluggable onto the backplane. The flexibility of the system architecture of the present invention allows for such configurations, which are easy to implement with the present architecture.

Other suitable chip sets (such as Intel's Extended Express) may also be implemented in the present architecture by defining the 352 bit wide bus between the CPU card and memory card in accordance with the chip set.

Figure 5A:
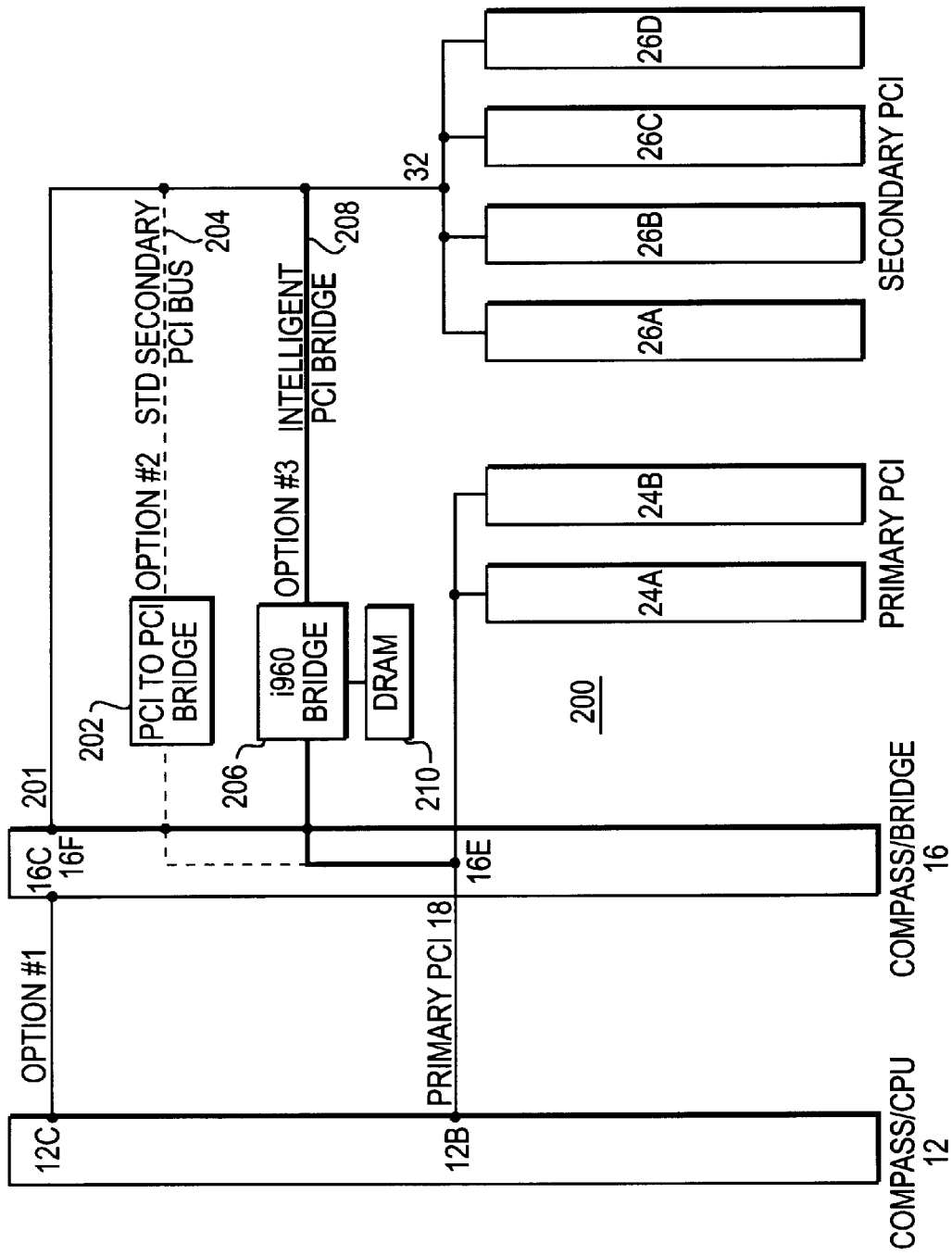
FIG. 5A illustrates different options for using secondary PCI connectors.

Another unique feature of the present invention is a second set of PCI connectors in addition to the primary PCI, as discussed above. Thus, the present embodiment preferably has six 32 or 64 bit PCI slots, where two PCI slots are considered to be part of the primary PCI bus and four PCI slots are attached to an alternate PCI bus structure. The alternate structure can be driven by a variety of sources. The alternate structure can be driven, among others, as (1) a second primary bus attached to the processor's local bus as with the Pentium Pro™ chip set, for example, (2) a secondary PCI bus using a buffered controller, or (3) an intelligent PCI subsystem with a buffered PCI-to-PCI bridge that includes an imbedded processor and substantial buffering. The alternate structure allows the I/O performance of the system to be tailored to the type of environment the system is running under. FIG. 5 shows the three options in more detail.

Referring to FIG. 5, in the first option, the CPU drives the alternate structure as a second primary PCI bus 201. For example, a microprocessor on the CPU card attached to the CPU connector unit 12 drives the second primary PCI bus 201. The signals from the second primary PCI bus 201 exits the CPU card through connector 12C and enters the bridge card attached to the bridge connector unit 16 at connector 16C. The signals from connector 16C passes through the bridge card at connector 16F and to PCI slots 26A, 26B, 26C, and 26D (see FIG. 1). Thus, the first option effectively supplements the original two primary PCI slots with four additional primary PCI slots.

Figure 5B:
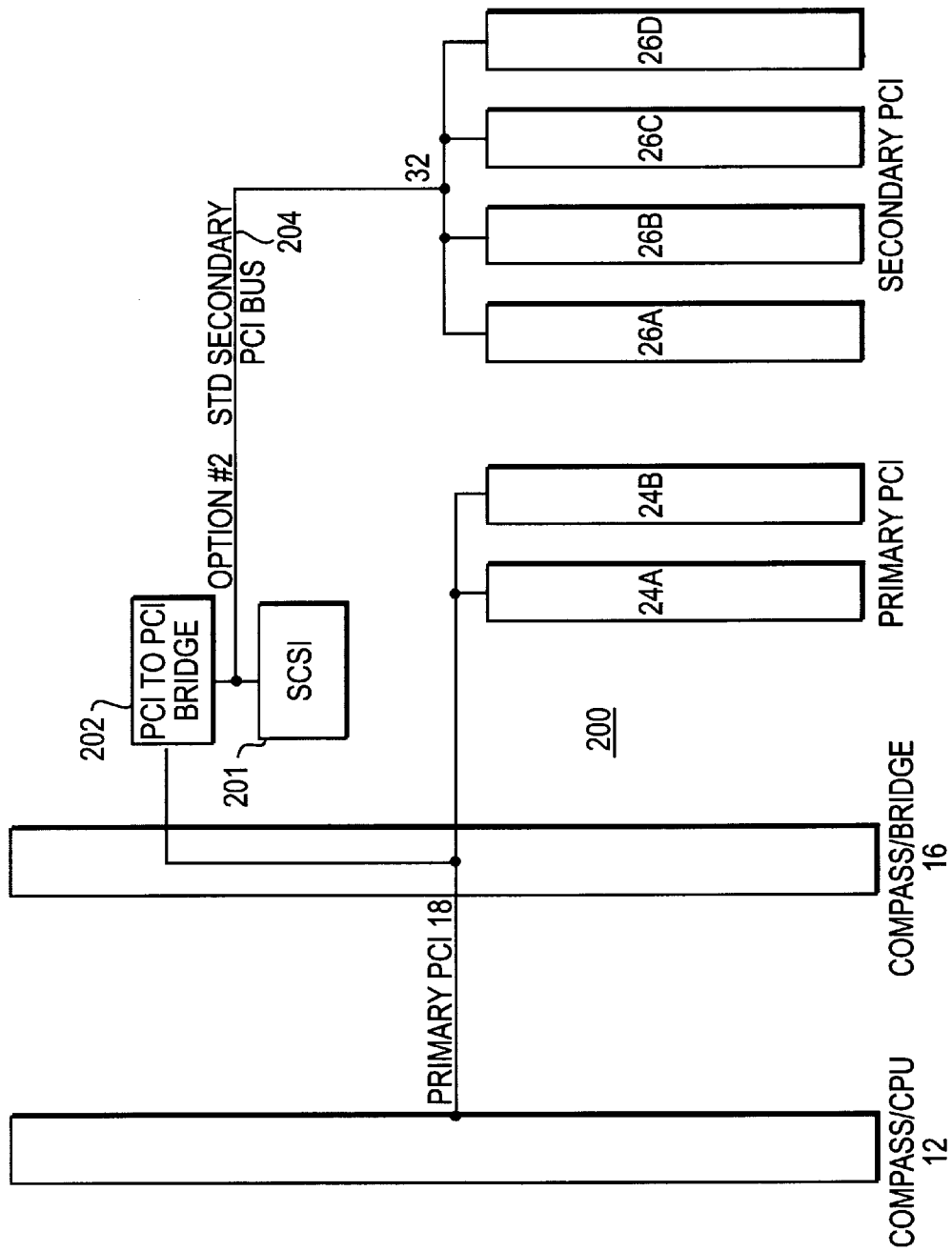
FIG. 5B illustrates an exemplary embodiment of a second option in FIG. 5A.

In the second option, the alternate structure is driven as a secondary PCI bus using a buffered controller. Here, a PCI-to-PCI bridge 202 connects the primary PCI bus 18 and the secondary PCI bus 204 which is connected to the secondary PCI slots (26A–D). The PCI-to-PCI bridge 202 contains a chip that passes PCI cycles between the primary and secondary PCI. For example, the PCI-to-PCI bridge 202 may cycle the SCSI controller 201 onto the secondary bus 204 and then to the primary bus 18, as shown in FIG. 5B. For the second option, the primary PCI bus 18 is driven by a microprocessor on the CPU card attached to the CPU connector unit 12. The signals from the primary PCI bus 18 exits the CPU card at connector 12B and enters the bridge card attached to the bridge connector unit 16 at connector 16E. The primary PCI bus 18 is connected to a PCI-to-PCI bridge 202 (such as DEC's 21050 or 21052) and the primary PCI bus signals are translated by the bridge 202 to a secondary PCI bus signals. The secondary PCI bus signals exits the bridge card at connector 16F and terminates at PCI slots 26A, 26B, 26C, and 26D.

In the third option, the alternate structure includes an intelligent PCI subsystem with a buffered PCI-to-PCI bridge that includes an imbedded processor 206 and substantial buffering by a storage device 210 such as a DRAM. The processor 206 may preferably be an i960 which is an RISC processor from Intel Corporation that may be used in control applications and in some cases for high speed bit intensive designs such as high end graphics. In this instance, if the main memory is busy, the DRAM 210 provides a temporary storage of data until the main memory becomes free. In addition, the intelligent PCI bridge, peer-to-peer communication is facilitated and data can be transferred between components without the main memory. For the third option, signals travel through the primary and secondary buses similar to the second option except that the PCI-to-PCI bridge 202 is replaced by the intelligent i960 bridge 206 and DRAM 210.

Figure 6A:
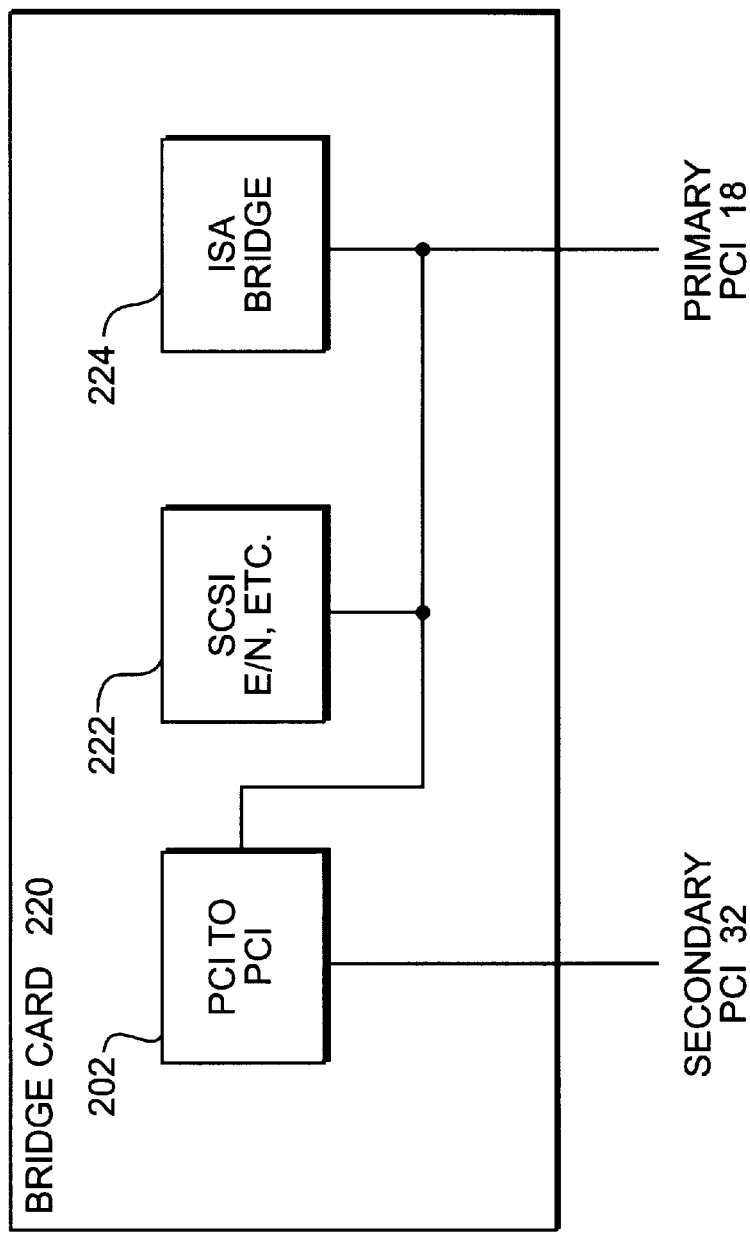
FIGS. 6A–6C are block diagrams illustrating alternative designs for the bridge card.

Moreover, since the primary PCI bus 18 is routed to two PCI slots 24A and 24B (see FIG. 1) and the bridge card (16E in FIG. 1, for example), and expansion buses including expansion bus #1 and #2 are available between the bridge and CPU, further PCI bus permutations can be configured into the architecture. For instance, referring to FIG. 6A, a localized secondary PCI bus 32—intelligent or not—can be created with a PCI-to PCI-bridge 202 from the primary PCI bus 18 on the bridge card 220. Here, the PCI-to-PCI bridge 202 connects to an ISA bridge 224 and to interface controllers such as SCSI, ethernet (E/N), etc. The localized secondary PCI bus 32 provides an increase in the number of imbedded functions on the bridge without violating a maximum loading condition on the primary PCI bus 18. This permits a low function graphics subsystem, such as the video graphics adapter (VGA), suitable for a server to be incorporated on the bridge card to free up a valuable PCI slot. Thus, many embodiments of the bridge card are possible due to the increase in the number of imbedded functions to provide further flexibility to the architecture.

Figure 6B:
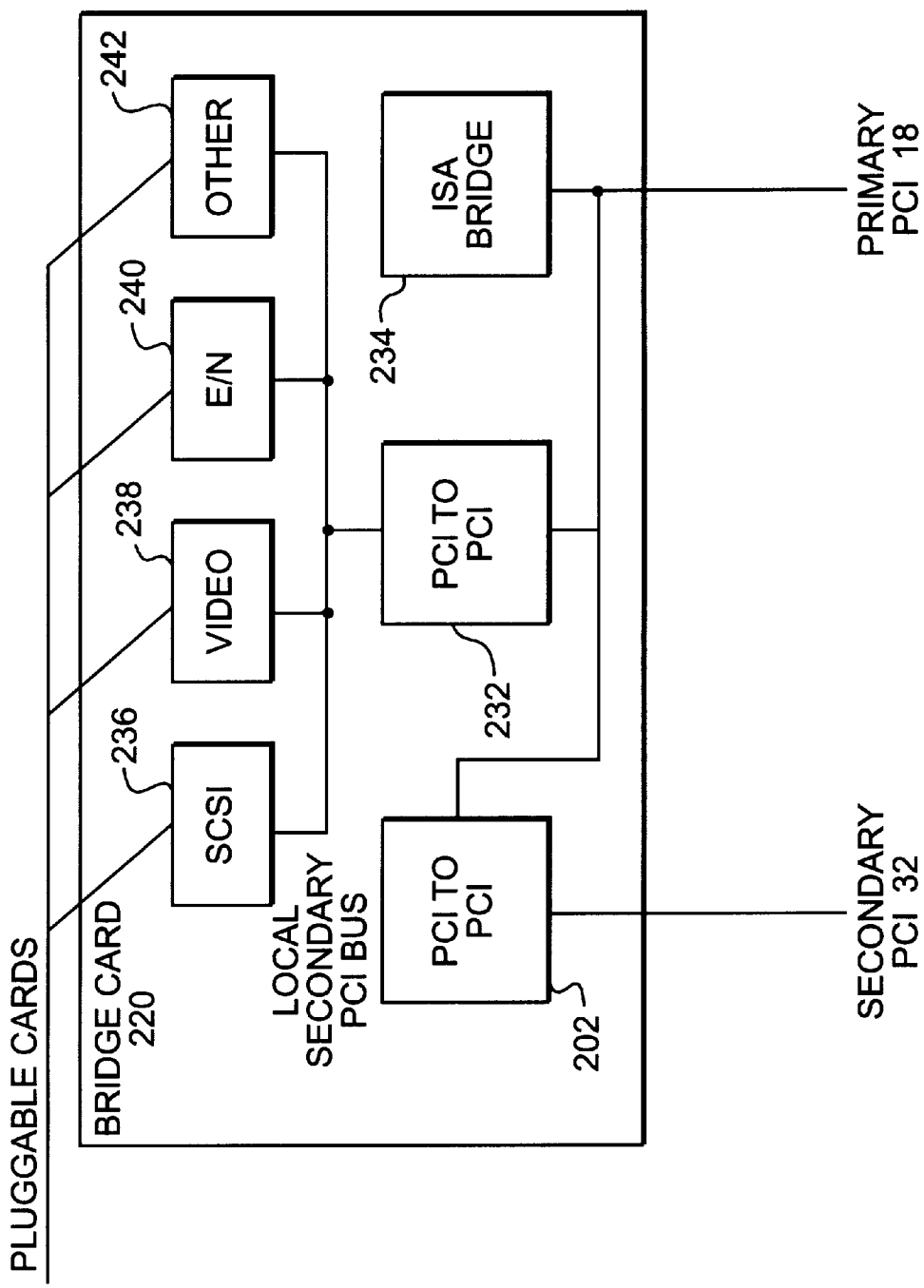

In one embodiment, since a single high density connector has enough pins for a 64 bit PCI, the bridge card 220 can contain a set of connectors to create pluggable islands for still more functions, as shown in FIG. 6B. For example, referring to FIG. 6B, the secondary PCI 32 connects to the primary PCI 18 through the PCI-to-PCI bridge 202. The PCI-to-PCI bridge 202 also connects to interface controllers such as SCSI 236, video 238, ethernet (E/N) 240, and others 242 as desired, through another PCI-to-PCI bridge 232 which may or may not be intelligent. Here, the interface controllers are preferably daughtercards that are pluggable onto the bridge card 220. Also, a local secondary PCI bus 244 is on the bridge card 220 to facilitate the transfer of data to and from the controllers.

Figure 5C:
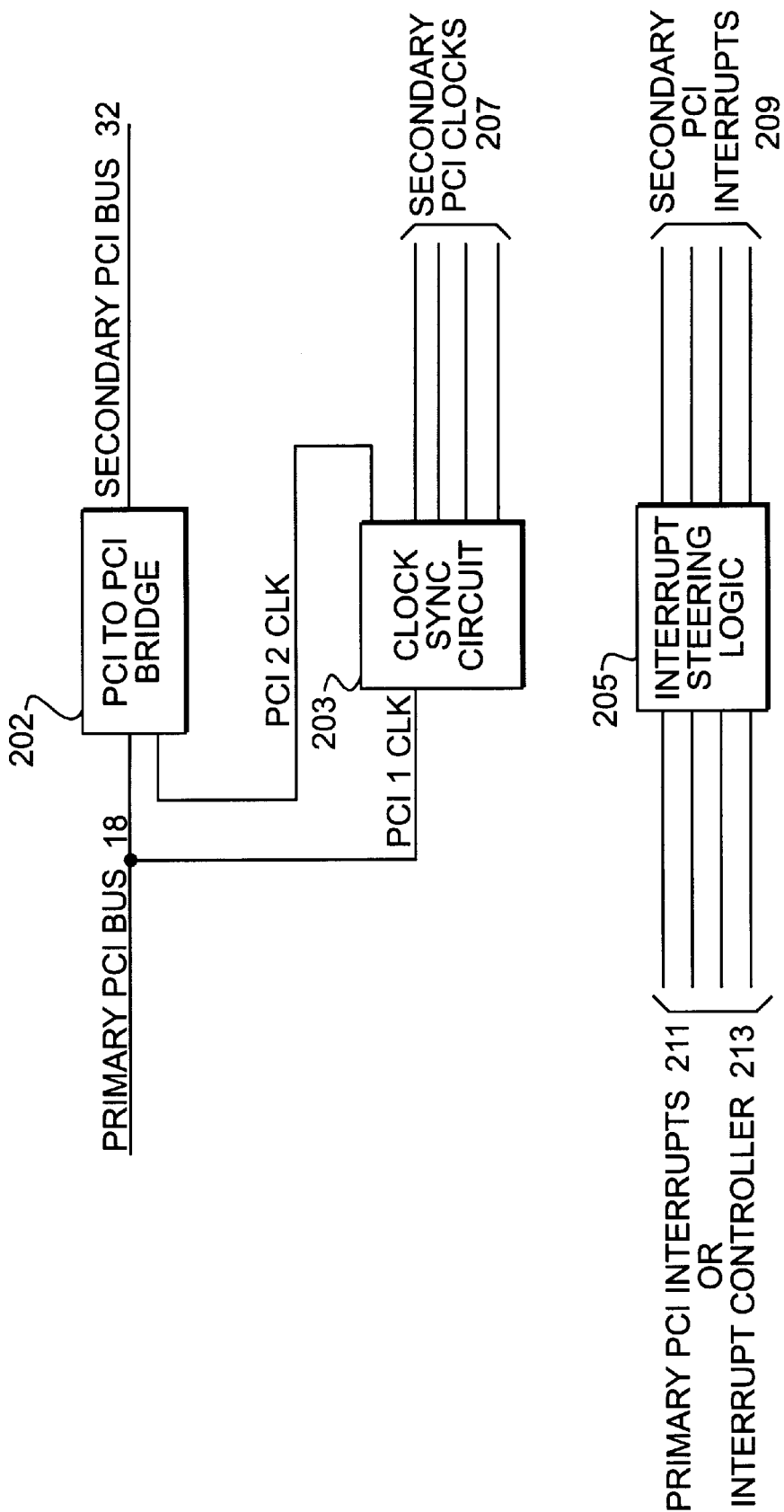
FIG. 5C is a block diagram of a PCI-to-PCI bridge logic that may be used in 5B.

An unintelligent bridge merely passes cycles back and forth between the busses based on address codes, such as shown in FIG. 5B and explained above. If the bridge is programmed to pass memory cycles in a certain range, it will do so each time a cycle appears on the PCI bus. An exemplary PCI-to-PCI bridge logic is shown in FIG. 5C. In FIG. 5C, a PCI-to-PCI bridge 202 (such as DEC's 21050) is connected to primary PCI bus 18, first PCI clock (PCI 1 CLK), and second PCI clock (PCI 2 CLK). The clock synchronization circuit 203 is connected to the primary PCI bus 18 through the first PCI clock and to the PCI-to-PCI bridge 202 through the second PCI clock. The clock synchronization circuit 203 includes a phase locked loop (PLL) and a buffer and outputs secondary PCI clocks 207 to I/O devices (one per device). An interrupt steering logic 205 receives primary PCI interrupts 211 or interrupt controller 213 and outputs secondary PCI interrupts 209. Typically, the interrupt steering logic 205 is directly connected to primary PCI interrupts 211.

An intelligent bus not only passes cycles between the busses, but it can also initiate transfers based on commands set to it by the CPU. An intelligent bridge could send data to an adapter from memory by being programmed with a source address, a target address, and a count.

Figure 6C:
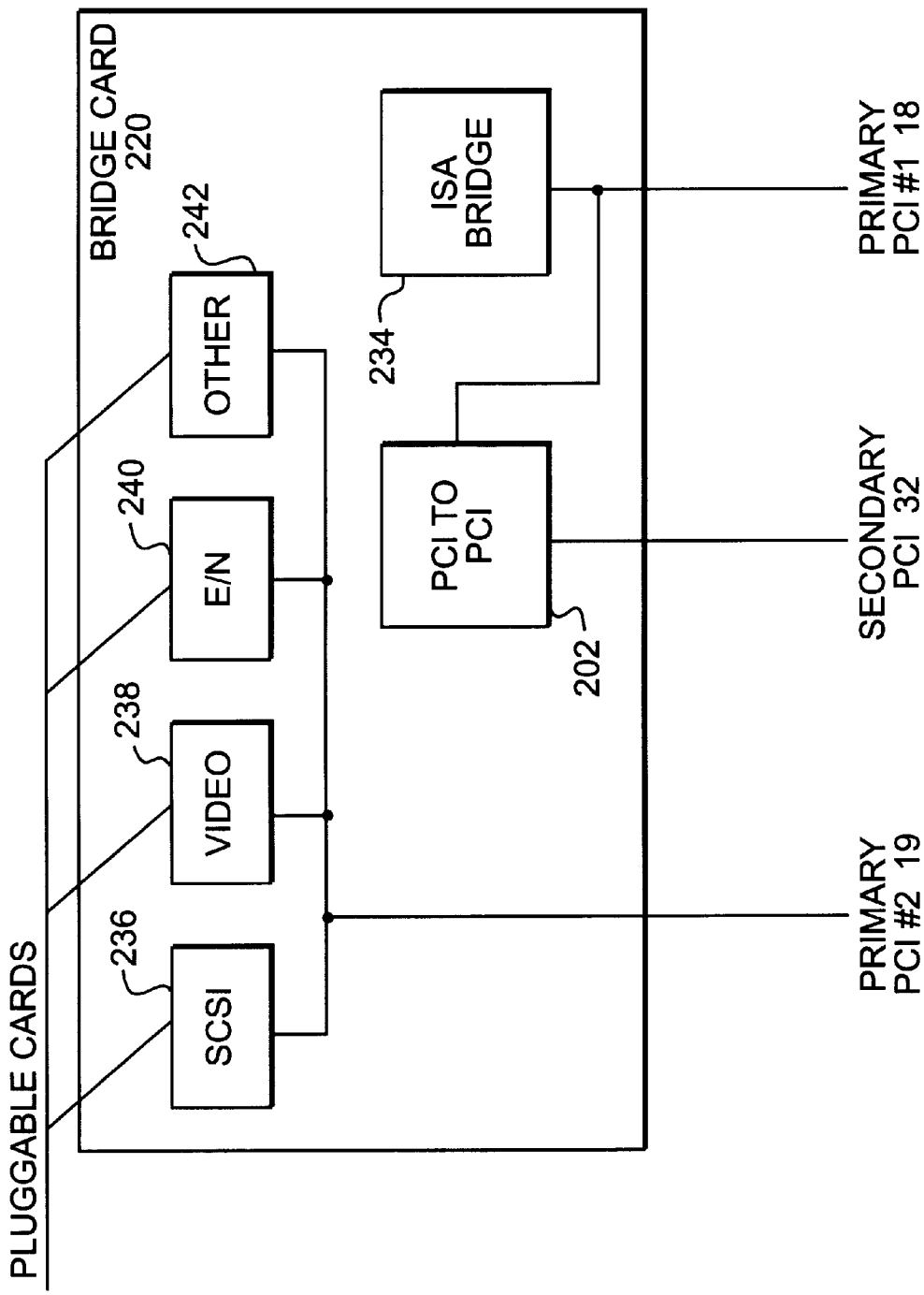

In another embodiment, one of the expansion busses could be utilized to provide for a 64 bit wide, 66 MHz PCI bus on the bridge card which would greatly improve the performance of the imbedded SCSI, ethernet (E/N), and video controllers, for example. In particular, referring to FIG. 6C, the bridge card 220 preferably includes a PCI-to-PCI bridge 202 between a secondary PCI 32 and first primary PCI 18, as discussed above. Also, an ISA bridge is connected to the first primary PCI 18. A second primary PCI 19 acts as an expansion bus (see FIG. 1) on the bridge card 220 and is connected to imbedded interface controllers such as SCSI 236, video 238, ethernet (E/N) 240, and others 242, as desired. The second primary PCI 19 preferably operates at a higher speed and/or bandwidth than the first primary PCI 18. For example, the second primary PCI 19 operates at 66 MHz and is 64 bits wide. In this instance, the speed of the bus is double the first primary PCI 18 to greatly improve the performance of the imbedded controllers. As with the previous embodiment of the bridge card, the interface controllers may be daughtercards that are pluggable onto the bridge card.

Accordingly, primary and secondary PCIs provide various options in configuring the bridge card. All of these alternative embodiments are possible due to the increase in the number of imbedded functions on the bridge card. The increase in the number of imbedded functions provides further flexibility to the system which derives from the fluid or flexible backpanel architecture of the present invention.

The flexible backpanel architecture can accommodate various microprocessors such as Intel's family of microprocessors including the 80486, Pentium™, and Pentium Pro™ (P6) microprocessors, Digital Equipment Corporation's Alpha™ RISC processor, and IBM's Power PC™. Of course, other microprocessors may be used. The chosen microprocessor(s) is (are) designed into the CPU card. In addition to the CPU card, the bridge card may also contain microprocessor(s) either to supplement the CPU card or as part of an intelligent PCI-to-PCI bridge, for example, as discussed above.

Figure 7:
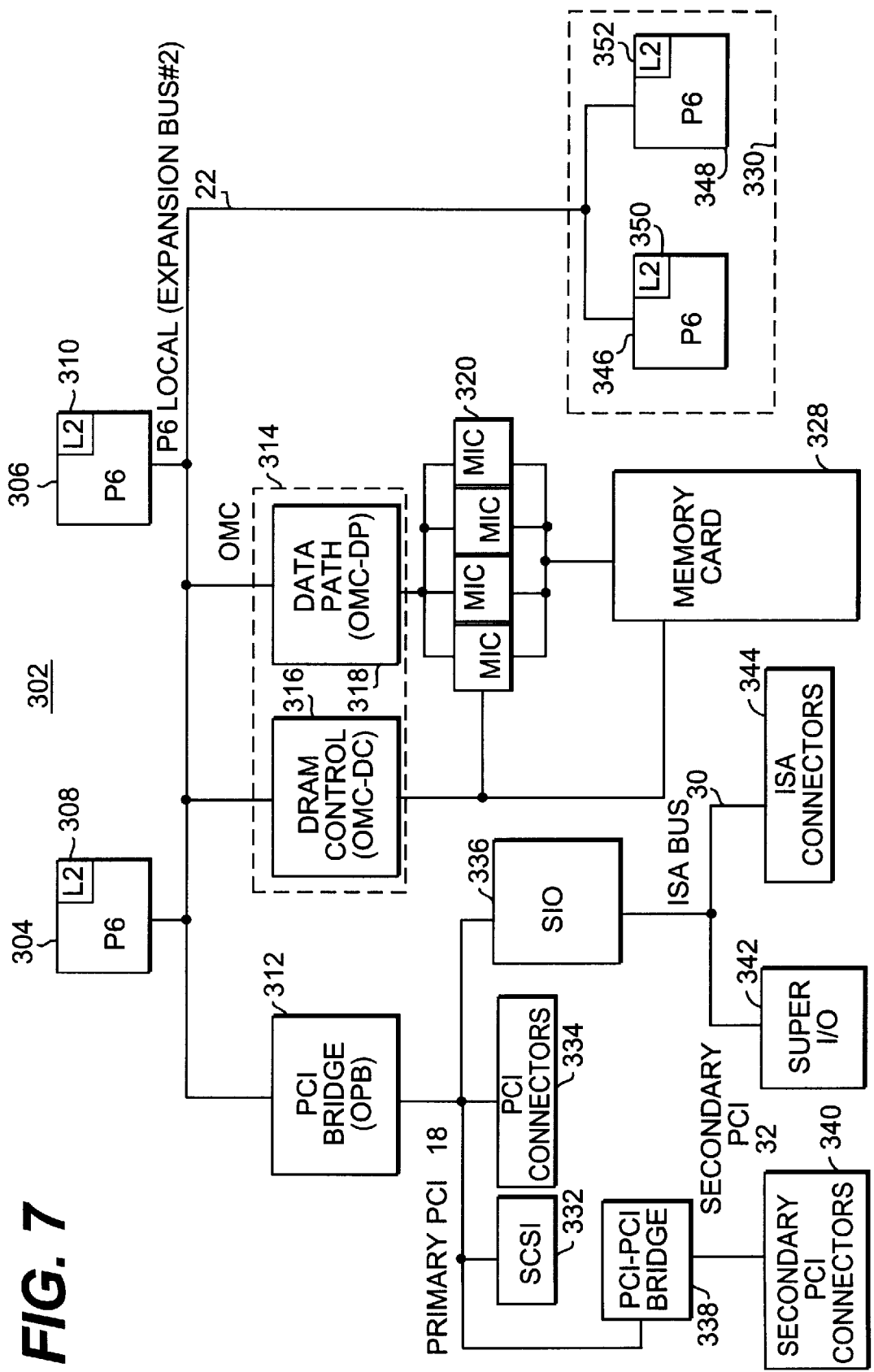
FIG. 7 is a block diagram for an Intel Pentium Pro™ (P6) system design in accordance with the present invention.

FIG. 7 is a high level block diagram of a Pentium Pro™ (P6) system design that uses the same expansion bus (referenced above) for a multiprocessor (MP) bus (see FIG. 3). This topology, as discussed with reference to FIG. 3, allows for a four way MP design. If, however, four processors are not possible on the CPU card due to physical space constraints, for example, only two processors (304, 306) may be used on the CPU card 302, as shown in FIG. 7. In this instance, the flexible architecture of the present invention allows users to further improve their system performance by selecting a bridge card 330 that supports two additional processors (346, 348). Thus, the bridge card 330 performs functions that would normally be performed on the CPU card 302. This is yet another example of the flexibility of the present architecture designed with a large number of uncommitted signals between the CPU, memory, and bridge cards.

Referring to FIG. 7, two P6 microprocessor based CPU units (304 and 306) are included on the CPU card 302. Each CPU unit includes a P6 processor, an L2 cache and cache control (similar to the CPU units discussed earlier with reference to FIG. 3). The CPU units 304 and 306 are connected to an MPI bus (P6 local), using expansion bus #2 (see FIG. 1). The CPU card 302 also includes a PCI bridge 312 (such as the Orion PCI Bridge-OPB), a memory controller 314 such as the Orion Memory Controller-OMC (Orion is Intel's code name for their P6 chip set which functions similarly to the HYDRA™ chip set in that it is targeted at a multiprocessor design), and a plurality of memory interface components (MIC) 320. The memory controller 314 includes a DRAM control 316 (such as the OMC-Data Control) and a data path unit 318 (such as the OMC-Data Path). The MICs 320 are connected to a memory interface 328 which comes between the CPU card 302 and the memory card 328.

The bridge card 330 in FIG. 7 includes the additional two P6 microprocessor based CPU units (346, 348) for improving performance. These CPU units are also connected to the MPI bus (P6 local). The bridge card 330 also includes SCSI controller 332, system I/O controller (SIO) 336, PCI-to-PCI bridge 338, and super I/O 342. The remainder of the blocks in FIG. 7 including the primary PCI connectors 334, secondary PCI connectors 340, and ISA connectors 344 are part of the backpanel.

The P6 design also makes use of the variable data path widths on the backplane of the present architecture by supporting a 128 bit memory data bus. Typically an industry standard upgradable design would be restricted to whatever the original system supported in terms of bus width, such as 64 bits for Pentium™. However, because the CPU card of the present invention is a pluggable subsystem and the bus width can expand up to 256 bits or higher, the full potential of the upgrade processor can be realized with the present architecture.

For example, the present architecture can support a variety of different processors since the CPU card containing the processor is a pluggable subsystem. The architecture can easily switch from a 64 bit microprocessor such as the Pentium™ processor to a 128 bit microprocessor such as the Pentium Pro™ (P6) processor or the Alpha™ RISC processor. The switch is easy because the 64 bit processor based CPU card is pulled out of the CPU card slot and replaced by the 128 bit processor based CPU card which is plugged into the CPU card slot. The backplane of the architecture fully supports the 128 bit wide data path required by the new CPU card since the backplane already has a data path width of 256 bits or more. Moreover, the switch becomes virtually transparent to the rest of the system components including the memory card and the bridge card. This capability is explained in more detail below.

In the present invention, system modifications (switches or upgrades) can be done in many ways. For example, the memory card, the CPU card and/or the bridge card can be upgraded for higher performance.

Modification to the system memory will be explained with reference to an upgrade from a 64 bit data width to a 128 bit data width and further to a 256 bit data width. To switch from a 64 bit data width to a 128 bit data width system while maintaining a compatible support on the CPU card, the existing 64 bit memory card which occupies only one high density connector 14A is replaced by two 64 bit memory boards attached to high density connectors 14A and 14B. Of course, a singly memory board containing the two 64 bit memory boards can be used also. The two 64 bit memory boards utilize 128 bits of the 256 bit data path already existing on the system backplane. Thus, the data width has doubled from 64 bits to 128 bits resulting in a higher performance data transfer. Similarly, a 64 bit or a 128 bit data width system can be upgraded to a 256 bit data width system. In this instance, a memory card utilizing 256 bits of data attaches to high density connectors 14A, 14B and 14C. Also, an additional set of high density connectors 14D, 14E, and 14F may be used to increase the memory size.

A CPU card may be upgraded by removing an existing CPU card and replacing it with another CPU card designed with a higher performance microprocessor having higher data bits, for example. If the replacing CPU card supports a wider memory width, it will utilize high density connectors 12D, 12E and/or 12F depending on the data width. For instance, a 64 bit CPU card may only need connector 12D (in addition to connector 12B for the PCI bus), a 128 bit CPU card may need connectors 12D and 12E, and a 256 bit CPU card may need connectors 12D, 12E and 12F to fully support the maximum data bit capabilities of a particular CPU card. CPU cards utilizing wider memory widths may include additional support logic for driving extra data and control signals through connectors 12E and 12F (for example, second control bus and additional data lines). Such signals include:

| For 64 bits + 8 checkbits (using connector 12D): | | |
|---|---|---|
| CASA[0:7] | Column Address Strobe | |
| RASA[0:7] | Row Address Strobe | |
| WEA[0] | Write Enable | |
| MAA[0:14] | Memory Address | |
| MDA[0:71] | Memory Data | |
| For 128 bits + 16 checkbits (using connector 12D and 12E): | | |
| CASA[0:7] | CASB[0:7] | |
| RASA[0:7] | RASB[0:7] | |
| WEA[0] | WEB[0] | |
| MAA[0:14] | MAB[0:14] | |
| MDA[0:71] | MDB[0:71] | |
| For 256 bits + 32 checkbits (using connector 12D, 12E and 12F): | | |
| CASA[0:7] | CASB[0:7] | |
| RASA[0:7] | RASB[0:7] | |
| WEA[0] | WEB[0] | |
| MAA[0:14] | MAB[0:14] | |
| MDA[0:71] | MDB[0:71] | MDC[0:143] |

Here, the MDA[0:71] represents the 64 bits plus the 8 checkbits, MDA[0:71] and MDB[0:71] represent the 128 bits plus the 16 checkbits, and MDA[0:71], MDB[0:71] and MDC[0:143] represent the 256 bits plus the 32 checkbits.

In addition to the memory and CPU cards, the bridge card can be modified or upgraded. One reason for modifying the bridge card is to add new functions such as additional SCSI chips, improved video, or better ethernet. This requires either the removal of an existing bridge card and replacing it with a new bridge card containing the added functions or removing a component (such as a fast SCSI) on the existing bridge card and replacing it with another compatible component (such as an ultra SCSI). Moreover, any new ROM code support exists on the new bridge card to resolve the compatibility issue for the components in the new bridge card.

Other reasons for modifying the bridge card include the expansion of the number and/or width of PCI buses and the addition of a bus between the CPU and bridge cards to migrate functions between the two.

To upgrade a bridge card to expand the number and/or width of the PCI buses, a coordinated upgrade would be needed with the CPU card (connector 12A and/or connector 12C). An expansion of the PCI bus (e.g., from 32 bits to 64 bits) may require a new support logic on the CPU card and bridge card, such as a 64 bit PCI controller. Here, the additional signal lines needed are already available on the high density connectors 12B and 16E (see FIG. 1). Adding additional PCI buses also requires new support logic on the CPU card and the bridge card, such as a second primary PCI controller (Intel OPB). When adding an additional primary PCI bus, signal traces between expansion connectors on the CPU card and the bridge card are used. The expansion connector pairs are 12A-16B and 12C-16C. As with the 12B-16E connector pair, the backplane is already equipped with the signal traces for signal pairs 12A-16B and 12C-16C. Each of the connector pairs 12A-16B and 12C-16C is capable of routing 114 traces (with 3:1 signal to power/ground ratio) between the CPU and the bridge, which is sufficient for 64 bit PCI signals. Thus, the architecture anticipates for future additions and expansions of PCI buses.

The bridge card can be upgraded to accommodate functions usually located in the CPU card. A bus can be added between the CPU and bridge cards to migrate functions between the two. Such upgrade also requires a coordinated removal and replacement of the CPU and bridge boards. Of course, if one of the two cards is already capable of migrating functions, then only one of the cards need the upgrade. Migration of functions also requires the use of expansion connector pairs 12A-16B and/or 12C-16C. For example, if LSI's MPI bus is used, then only one pair (with 114 I/O maximum, for example) is needed to migrate the functions because the number of signals is less than the capability of a single connector pair (see FIG. 3). However, if Intel's P6 bus is used, then both connector pairs would be needed since the P6 bus requires more the 114 signals. In this latter case, both expansion bus #1 and #2 are used (see FIG. 1). Moreover, if functions are migrated between the CPU and bridge cards and an additional PCI bus is added, then both connector pairs are also used to accommodate the greater number of signals required. Thus, the flexibility of the present architecture allows migration of functions between the CPU and bridge cards. Migration of functions also requires a support logic for the interconnected bus such as MPI bus controllers, MPI-to-PCI bridge, MPI memory controllers, and MPI CPU controllers. The support logic for the interconnected bus resides on the CPU and the bridge cards and the two cards communicates with each other through expansion traces at connectors 12A to 16B (expansion #1) and/or at connectors 12C to 16C (expansion #2). For example, referring to FIG. 7, function migration is shown where two microprocessors (P6) are located on the CPU card 302 and two microprocessors (P6) are located on the bridge card 330 and the microprocessors are interconnected by a P6 local bus. Here, expansion bus #1 is used for the multiprocessor bus and expansion #2 is used for the migration function purpose between the CPU and bridge cards. Also, the P6-to-PCI bridge 312 converts signals from the P6 local bus to the PCI bus.

Figure 8:
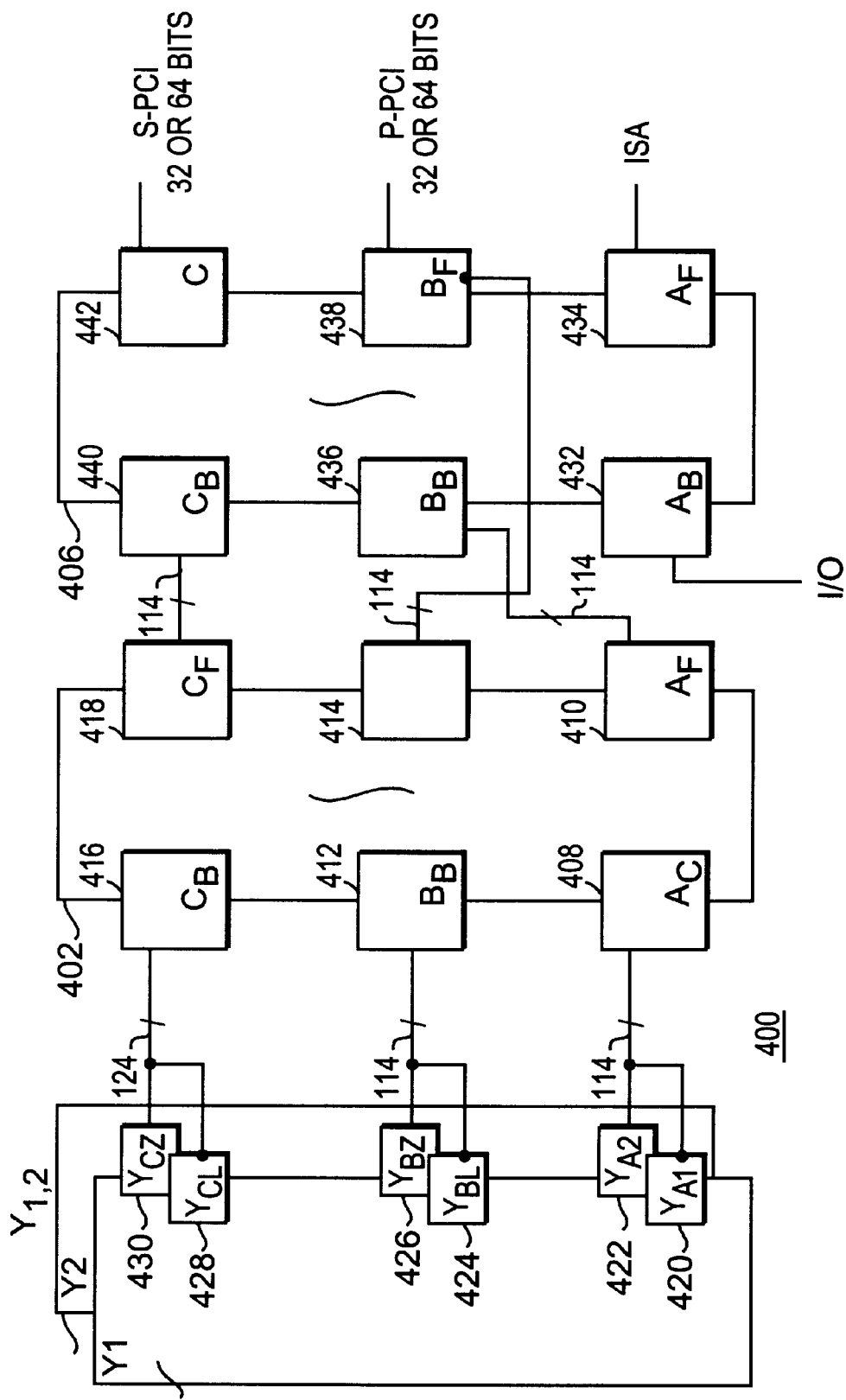
FIG. 8 is a block diagram of a backpanel subsystem interconnect including card slots for the CPU circuit board, memory circuit board, and bridge circuit board in accordance with the present invention.

FIG. 8 is an embodiment of a high level interconnect diagram for the backpanel of the present architecture. This diagram depicts the card slots for the CPU, memory, and bridge, the point-to-point connections, and the connectors that are dedicated to standard I/O structures. FIG. 8 shows four cards depicted as "X" 402 (typically the CPU card), "Z" 406 (typically the I/O controller or bridge card) and the "Y1/Y2" pair 404, 405 (which generally house base and/or expansion memory) The high density connectors attached to the cards are denoted by their row (A, B, C) and position on the card (back/front). Note that connectors Z-Af (434), Z-Bf (438), Z-Cf (442), and Z-Ab (432) of the bridge card 406 are attached to industry standard interfaces such as primary and secondary PCI, ISA or imbedded I/O connectors. The connection between X-Af (410) and Z-Bb (436) and the connection between X-Cf (418) and Z-Cb (440) are expansion busses #1 (20) and #2 (22), respectively, between the CPU and bridge cards (see FIG. 1 for expansion busses #1 and #2). Expansion bus #1 may function as the Pentium Pro™ Symmetrical Multiprocessor (SMP) bus, a high frequency local PCI bus, or even the ISA bus. Expansion bus #2 may function as another primary PCI bus, a portion of the SMP bus, or a control bus. These are implementations based on currently available chip sets. Future chip sets may require alternative connections that will change the actual definition of the expansion busses. The key, however, is that both ends of the bus—the CPU and bridge—understand the protocol. The signals may take on any logical or physical attributes so long as both cards are consistent with the definitions.

For instance, the Pentium Pro™ SMP bus is not a TTL or CMOS level bus but is based on a modified Gunning Transistor Level+ (GTL+) bus, as defined by the Intel Corporation. The X and Z cards are double sided cards (there are high density connectors on the front and back of the card). Hence, up to six connectors (912 I/O where each high density connector preferably has 152 pins) can be used for a card. However, only those connectors needed for a particular card set are used. Unused busses do not have connector positions populated. For example, the Pentium™ CPU card with 64 bits has three high density connectors populated while the Alpha™ CPU with 128 bits has four connectors. The pair of Y cards (Y1 and Y2) are single sided cards which can have various lengths depending on the function. For example, if only the Y-A (420, 422) and Y-B (424, 426) connector positions are considered, the system may treat connectors Y-A1 (420), Y-A2 (422), Y-B1 (424) and Y-B2 (426) as individual 64 bit memory slots that accept partially buffered DRAM cards similar to the DIMM (Dual In-line Memory Module) memory standard. These cards can be addressed as four individual 64 bit entities or, if symmetrical cards are populated, two 128 bit slots.

Moreover, from the 152 pins or contacts of a connector, 114 pins or contacts are generally used for I/O and the remaining pins are used for power and ground to achieve a 3:1 ratio between signal and power/ground. However, for some connectors, a slightly higher than 3:1 ratio may be used to accommodate for higher pin requirements for a particular application.

In order to further improve and expand the memory bus width, a card can be designed that plugs into the Y-A, Y-B and Y-C connector positions. This card supports a full 256 bit data bus. (and can also support narrower busses).

As shown in FIG. 8, connections from the Y1 (404) and Y2 (405) cards to the X (402) card include a 124 bit bus from Y-C1 (428) and Y-C2 (430) to X-Cb (416), a 114 bit bus from Y-B1 (424) and Y-B2 (426) to X-Bb (412), and a 114 bit bus from Y-A1 (420) and Y-A2 (422) to X-Ab (408). The total number of bits is 352 bits between Y1, Y2 and X cards. The 352 bits in this instance represents 256 bits for data, 64 bits for control signals, and 32 bits for ECC. Here, the 64 bits for control signals includes memory address, row address strobe, column address strobe, and write enable. The 256 bits for data is the maximum number of bits in this embodiment but one of ordinary skill in the art can easily design a higher number of bits into the architecture in accordance with the present invention. Of course, microprocessors with fewer bits use a subset of bits from the 256 bit data bus, as discussed earlier.

The memory cards can be populated with loose DRAMs or they can include a number of sockets for industry standard 72 pin SIMMs or 168 pin DIMMs. This flexibility provides systems to be constructed with a variety of memory configuration depending on what the target customer needs. For example, an enterprise having a large investment in 72 pin SIMMs can reuse the SIMMs on the memory card of the present invention. Note that all of the DRAM subsystem implementations can support error reporting (via parity), error checking and correction (via ECC) or a low cost design which removes the additional error indicator DRAMs.

Figure 9A:
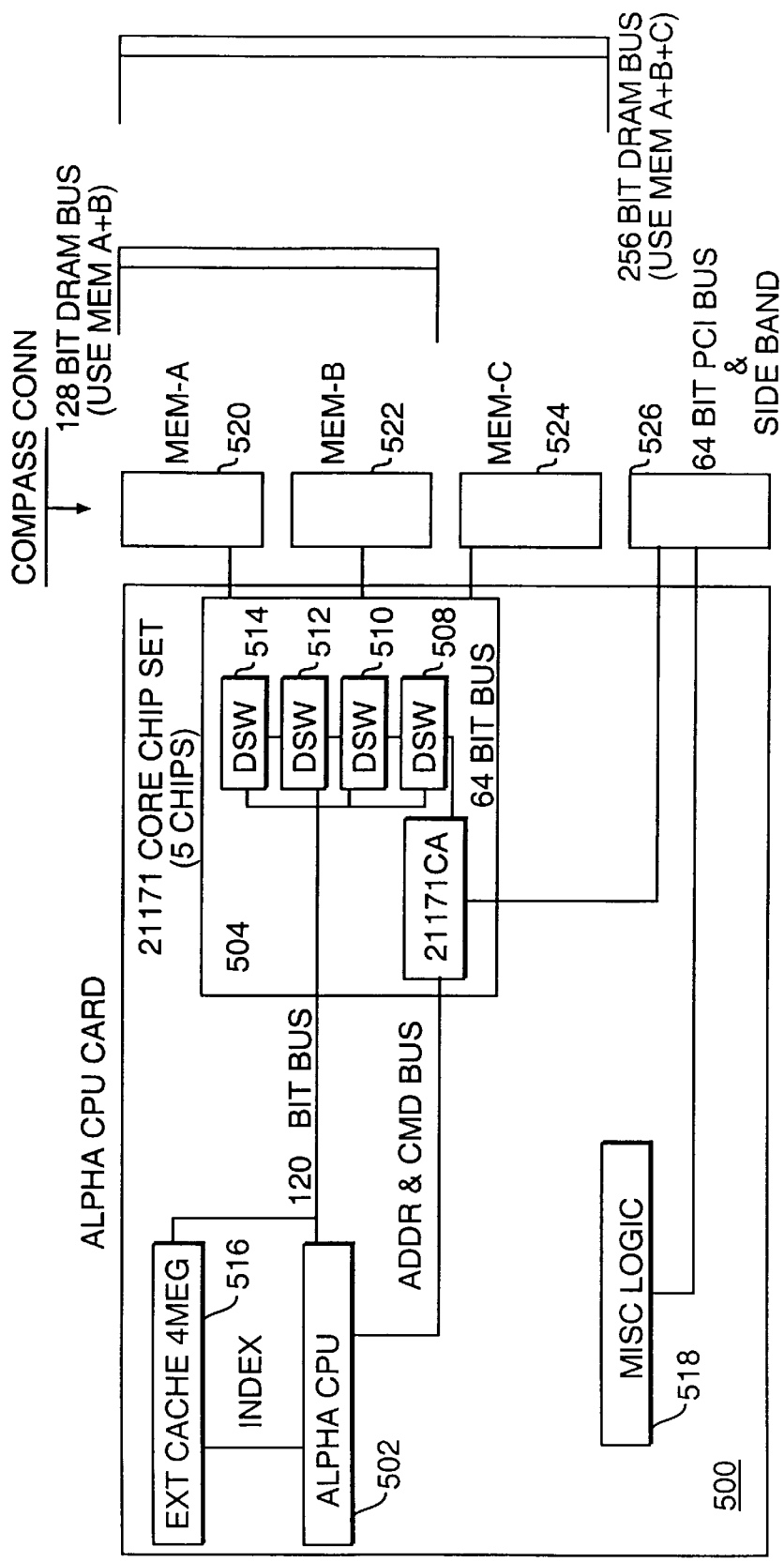
FIGS. 9A and 9B are block diagrams for a. Digital Equipment Corporation (DEC) Alpha™ RISC processor system design in accordance with the present invention.
Figure 9B:
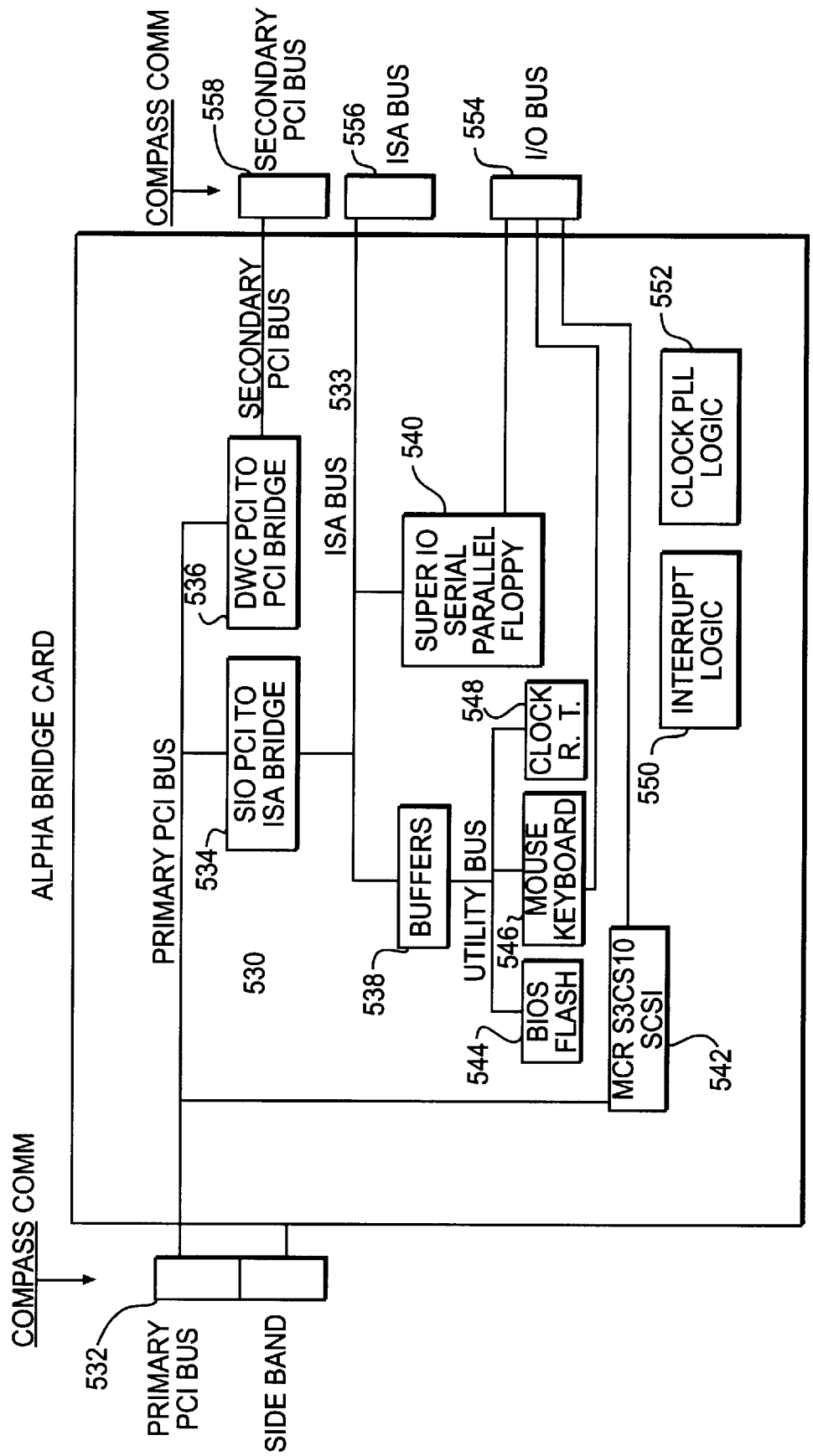
Figure 10:
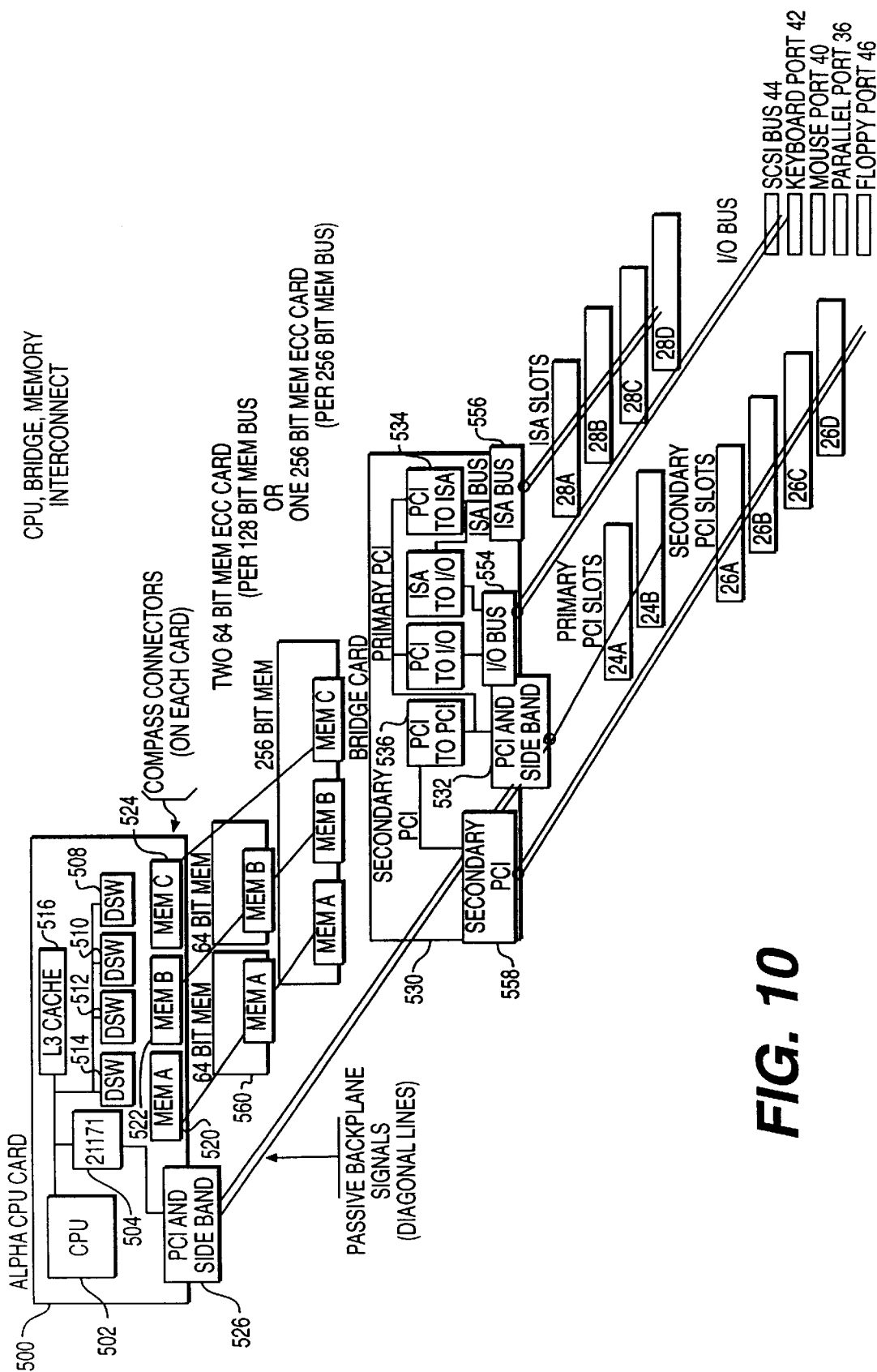
FIG. 10 shows the interconnection of the DEC Alpha™ system in FIGS. 9A and 9B.

The present architecture can support different processors from different manufacturers. FIGS. 9A, 9B, and 10 show the Digital Equipment Corporation's (DEC) Alpha™ RISC processor based card set including CPU card 500, memory card 560, and bridge card 530. The DEC Alpha™ can fully exploit the memory path width of the backpanel by supporting the 256 bit wide interface with a single bit correct, double bit error detect ECC. When compared to the Pentium™ design, the bridge card 530 is functionally similar but the actual chips selected for the imbedded functions (such as SCSI 542, keyboard/mouse 546, super I/O 540) may be different. The fact that the I/O chip sets are flexible is also significant because some "non-Intel" processors might only have code support for a particular set of I/O controllers. If those chips were forced to be common with all of the CPU cards, one of two events would occur. Either the system development cost and time would increase to rewrite code to support the different I/O controllers on a "non-Intel" platform, or the Intel platforms would be locked into particular I/O controllers which would decrease the flexibility of the product. Thus, the ability to change a substantial portion of the control logic in a system by swapping a set of two boards is a key attribute to the flexible architecture.

The Alpha™ based system in accordance with the present invention will be discussed in detail with reference to FIGS. 9A, 9B and 10. As shown in FIG. 9A, the Alpha™ based CPU card 500 includes an Alpha™ RISC processor 502, a core chip set 504 including a PCI bridge 506, which translates data format from the processor local bus to PCI bus 526, and data switches (DSW) 508, 510, 512, and 514. The PCI bridge 506 may include DEC's core logic chip 21171CA, which provides the PCI bus and memory control signals based on the local processor bus. The data switches are similar to the memory interface components (MIC) 320 in FIG. 7 and they are connected to the Alpha™ processor through a 128 bit bus. The PCI bridge 506 is connected to the DSWs through a 64 bit bus, to the Alpha™ processor 502 through an address and command bus, and to a 64 bit PCI bus 526. The CPU card 500 also includes an external cache 516 which is also connected to the DSWs through the 128 bit bus. The core chip set supports five chips in this instance and is connected to the memory card through high density memory connectors MEM-A 520, MEM-B 522, and MEM-C 524. For a memory card with a 128 bit DRAM bus, only MEM-A and MEM-B are used but for a memory card with a 256 bit DRAM bus, MEM-A, MEM-B, and MEM-C are used. The Alpha™ CPU card 500 also includes a miscellaneous logic unit 518 including clock distribution, reset control, and interrupt steering.

The bridge card 530 for the Alpha™ based system is shown in FIG. 9B. The bridge card 530 receives data from the CPU card 500 through the primary PCI bus 532 which is connected to the PCI bus 526 (FIG. 9A). The bridge card 530 includes a PCI-to-ISA bridge 534 and a PCI-to-PCI bridge 536, which is connected to a secondary PCI bus 558. The PCI-to-ISA bridge 534 translates data format from the PCI bus 532 to the ISA bus 533. The ISA bus 533 is connected to a super I/O 540, which includes serial/parallel ports and a floppy disk controller. The ISA bus 533 is also connected to buffers 538, which are connected to a utility bus with a bios flash 544, mouse and keyboard 546, and a clock 548, for example. The primary PCI bus 532 is also connected to a SCSI controller 542, which is connected to the I/O bus 554. The I/O bus 554 is also connected to the super I/O 540 and mouse and keyboard 546. The bridge card 530 also includes an interrupt logic 550 and a clock logic 552. The interrupt logic 550 and the clock logic 552 are connected to the primary PCI bus at their respective inputs, and their respective outputs are connected to the secondary PCI bus (connections not shown).

The memory card 560 is shown in FIG. 10 along with the CPU card 500, bridge card 530, and other components of the system including primary and secondary PCI slots, ISA slots, and I/O. The diagonal lines represent passive backplane signal traces of the architecture. The memory card 560 for the Alpha™ system includes two 64 bit DRAM ECC card which requires a 128 bit bus, or one 256 bit DRAM ECC card which requires a 256 bit memory bus. Of course, since the system is already designed with a 256 bit bus, only 128 bits of the 256 bits are used for the 128 bit bus, whereas all of the 256 bits are used for the 256 bit bus. Accordingly, with the Alpha™ system, a designer may choose from either two 64 bit memory card design or one 256 bit memory card design, both of which are fully supported by the present architecture.

As shown in FIG. 10, the PCI bus 526 is connected to the PCI 532 and to primary PCI slots 24A and 24B. The secondary PCI bus 558 is connected to second PCI slots 26A, 26B, 26C, and 26D. The ISA bus 556 is connected to the ISA slots 28A, 28B, 28C, and 28D. The I/O bus 554 is connected to the SCSI bus 44, keyboard port 42, the mouse port 40, the parallel port 36, and serial port 46.

Figure 11:
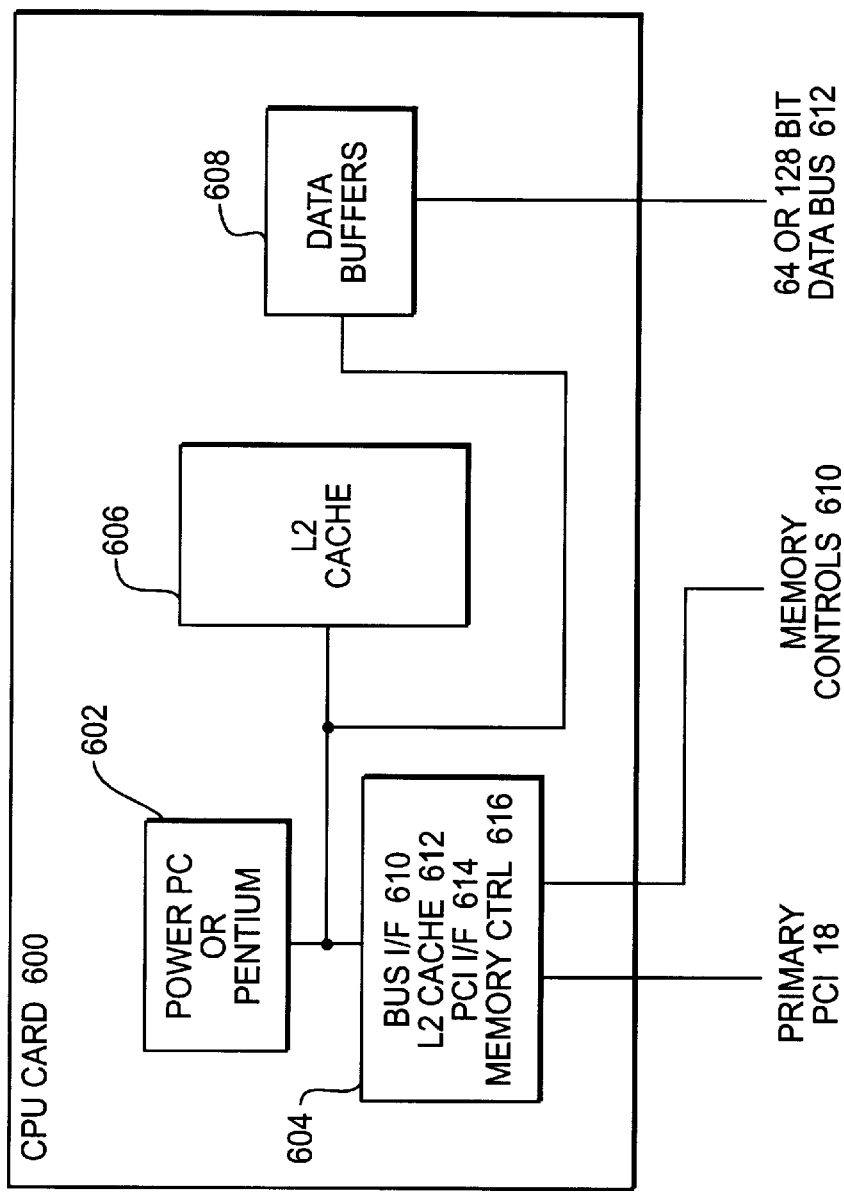
FIG. 11 is a block diagram of an IBM Power PC™ or a Pentium™ processor based CPU circuit board in accordance with the present invention.

FIG. 11 shows a CPU card configuration for a Power PC™ processor from IBM or Pentium™ processor from Intel. The Power PC™ based CPU card is similar to the Pentium™ based CPU card. The Power PC™ processor is also an attractive architecture for the present invention, especially when the Common Hardware Reference Platform (CHRP) is fully supported by various Operating Systems (OS). The CHRP, a combined effort by IBM, Motorola, and Apple, enables such software as Solaris™, Windows NT™, AIX™ and the MAC™ OS to run on the same hardware. The capability enabled by the flexible backplane and I/O subsystems of the present invention allows customers to directly access operating systems such as the PC and MAC OS environments within their enterprise with a great deal of common hardware elements The I/O subsystem on the bridge card for the Power PC™ can be similar to the bridge card for the Alpha™ processor where it matches the reference design to save development costs. Alternatively, one of the other bridges, as discussed earlier with reference to the Pentium™ and the RISC processors, may be utilized for the Power PC™ configuration which would minimize the hardware costs to transition from one processor architecture to another.

Referring to FIG. 11, the Power PCT™ (or Pentium™) based CPU card 600 includes a Power PC™ (or Pentium™) processor 602 connected to a block 604 (such as a processor controller memory controller PCMC from Intel) including a bus interface 610, L2 cache controller 612, PCI interface 614, and a memory control 616. The CPU card 600 also includes an L2 cache memory 606 and data buffer 608 which are connected to the processor 602. The components in block 604, the L2 cache memory 606 and/or data buffer 608 can be changed, if needed, to match the processor architecture.

Accordingly, with the flexible backplane architecture of the present invention, the type of microprocessor used becomes transparent to the architecture since the CPU card containing the microprocessor is a pluggable subsystem. Thus, a Pentium™ based computer system can be easily changed to an Alpha™ based system, a Power PC™ based system, or any other suitable microprocessor based system, such as the MIPS 4400. The variable data path of the present architecture easily expands the bus width to accommodate higher bit microprocessors.

It will be apparent to those skilled in the art that various modifications and variations can be made in the computer system architecture of the present invention without departing from the spirit or scope of the invention. For example, the description of the embodiments of the present invention has been made with reference to the microprocessors from Intel, DEC and IBM, other suitable microprocessors are also applicable to the architecture of the present invention. Moreover, the flexible architecture of the present invention foresees future microprocessors to be applicable to the present invention due to its flexible nature, as explained above. Thus, it is intended that the present invention cover the modifications and variations of this invention provided they come within the scope of the appended claims and their equivalents.

What is claimed is:

1. A computer system comprising:

a passive backplane including a local bus having a primary bus and a secondary bus, a memory bus having a maximum number of data lines, an input/output bus, and an expansion bus, the primary and secondary bus including a peripheral component interconnect (PCI) bus architecture, wherein the primary bus and secondary bus communicate with each other through a PCI to PCI bridge;

a pluggable central processing unit circuit board including a microprocessor and having a first mating connector of a first pair unit, the pluggable central processing unit circuit board having a predetermined data width;

a pluggable memory circuit board coupled to the central processing unit circuit board through the memory bus unit, and having a first mating connector of a second pair unit;

a pluggable bridge circuit board coupled to the central processing unit circuit board and having a first mating connector of a third pair unit; wherein the passive backplane having a plurality of connectors includes:

a second mating connector of the first pair unit for receiving the first mating connector of the first pair unit in the pluggable central processing unit circuit board;

a second mating connector of the second pair for receiving the first mating connector of the second pair unit in the pluggable memory circuit board; and a second mating connector of the third pair unit for receiving the first mating connector of the third pair unit in the pluggable bridge circuit board, wherein a subset of the first pair unit have predefined contacts and respectively coupled to a subset of the third pair unit through the primary bus and the expansion bus unit; and a plurality of peripheral devices coupled to the bridge circuit board through the input/output bus; wherein the memory bus of the bus system is capable of being configured to a variable data path width corresponding to a data size of a central processing unit of the central processing unit circuit board and accommodates for the central processing unit circuit board having the predetermined data width, the predetermined data width being less than or equal to the maximum number of data lines.

2. The computer system according to claim 1, wherein the third pair unit is coupled to the first pair unit through the local bus and the expansion bus.

3. The computer system according to claim 1, wherein the first pair unit of the central processing unit circuit board comprises at least 100 contacts per linear inch.

4. The computer system according to claim 1, wherein the second pair unit of the memory circuit board comprises at least 100 contacts per linear inch.

5. The computer system according to claim 1, wherein the third pair unit of the bridge unit comprises at least 100 contacts per linear inch.

6. The computer system according to claim 1, wherein the plurality of connectors includes surface mount connectors.

7. The computer system according to claim 1, further comprising an adapter bus coupled to the third pair unit.

8. The computer system according to claim 1, wherein the local bus includes a peripheral component interconnect (PCI) bus architecture.

9. The computer system according to claim 1, wherein the passive backplane further comprises a second local bus connected to the third pair unit.

10. The computer system according to claim 1, wherein the first pair unit includes six connectors coupled to the central processing unit circuit board, the second pair unit includes six connectors coupled to the memory circuit board, the third pair unit includes six connectors coupled to the bridge circuit board, three connectors of the first pair unit being coupled to three connectors of the third pair unit, and one connector of the third pair unit being coupled to the input/output bus.

11. The computer system according to claim 10, wherein one of the three connectors of the third pair unit is coupled to one of the three connectors of the first pair unit through the local bus.

12. The computer system according to claim 10, wherein remaining connector contacts of the first, second, and third pair units are not predefined.

13. The computer system according to claim 1, wherein the first pair unit has multiple connectors coupled to the central processing unit circuit board.

14. The computer system according to claim 1, wherein the second pair unit has multiple connectors coupled to the memory circuit board.

15. The computer system according to claim 1, wherein the third pair unit has multiple connectors coupled to the bridge circuit board.

* * * * *